(12) United States Patent
Kawato et al.

(10) Patent No.: US 10,711,338 B2
(45) Date of Patent: Jul. 14, 2020

(54) VAPOR DEPOSITION MASK AND MANUFACTURING METHOD FOR ORGANIC EL DISPLAY DEVICE

(71) Applicant: Sharp Kabushiki Kaisha, Sakai, Osaka (JP)

(72) Inventors: Shinichi Kawato, Sakai (JP); Manabu Niboshi, Sakai (JP); Eiji Koike, Sakai (JP); Satoshi Inoue, Sakai (JP); Tsuyoshi Inoue, Sakai (JP); Yuhki Kobayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 247 days.

(21) Appl. No.: 15/779,102

(22) PCT Filed: Jan. 26, 2017

(86) PCT No.: PCT/JP2017/002693
§ 371 (c)(1),
(2) Date: May 25, 2018

(87) PCT Pub. No.: WO2018/138824
PCT Pub. Date: Aug. 2, 2018

(65) Prior Publication Data
US 2019/0360086 A1    Nov. 28, 2019

(51) Int. Cl.
*H01L 51/56* (2006.01)
*C23C 14/04* (2006.01)
*C23C 14/24* (2006.01)
*H01L 51/00* (2006.01)

(52) U.S. Cl.
CPC ............ *C23C 14/042* (2013.01); *C23C 14/24* (2013.01); *H01L 51/001* (2013.01); *H01L 51/0011* (2013.01); *H01L 51/56* (2013.01)

(58) Field of Classification Search
None
See application file for complete search history.

(56) References Cited

U.S. PATENT DOCUMENTS

2002/0158570 A1    10/2002    Yamada et al.
2010/0192856 A1    8/2010     Sung et al.
(Continued)

FOREIGN PATENT DOCUMENTS

JP    10-330910 A      12/1998
JP    2002-289347 A    10/2002
(Continued)

OTHER PUBLICATIONS

Official Communication issued in International Patent Application No. PCT/JP2017/002693, dated May 9, 2017.

*Primary Examiner* — Jethro M. Pence
(74) *Attorney, Agent, or Firm* — Keating & Bennett, LLP

(57) ABSTRACT

A vapor deposition mask including a metallic substrate provided with a plurality of openings for passing vapor deposition particles, wherein at least a portion of the plurality of openings are structured by one or more opening groups in which the plurality of openings are repeatedly arranged in accordance with a constant rule, and a plurality of protrusions of identical height are arranged to support the entire substrate from one side, and are provided only outside the opening group formation region.

20 Claims, 19 Drawing Sheets

(56) References Cited

U.S. PATENT DOCUMENTS

| | | | | |
|---|---|---|---|---|
| 2013/0186335 | A1* | 7/2013 | Kawato | C23C 14/042 |
| | | | | 118/720 |
| 2016/0301006 | A1* | 10/2016 | Obata | H01L 51/0011 |
| 2016/0308131 | A1* | 10/2016 | Kobayashi | C23C 14/54 |
| 2017/0081758 | A1 | 3/2017 | Inoue et al. | |

FOREIGN PATENT DOCUMENTS

| | | |
|---|---|---|
| JP | 2003-323980 A | 11/2003 |
| JP | 2006-089793 A | 4/2006 |
| JP | 2006-284674 A | 10/2006 |
| JP | 2008-041327 A | 2/2008 |
| JP | 2010-180476 A | 8/2010 |
| JP | 2015-214740 A | 12/2015 |

* cited by examiner

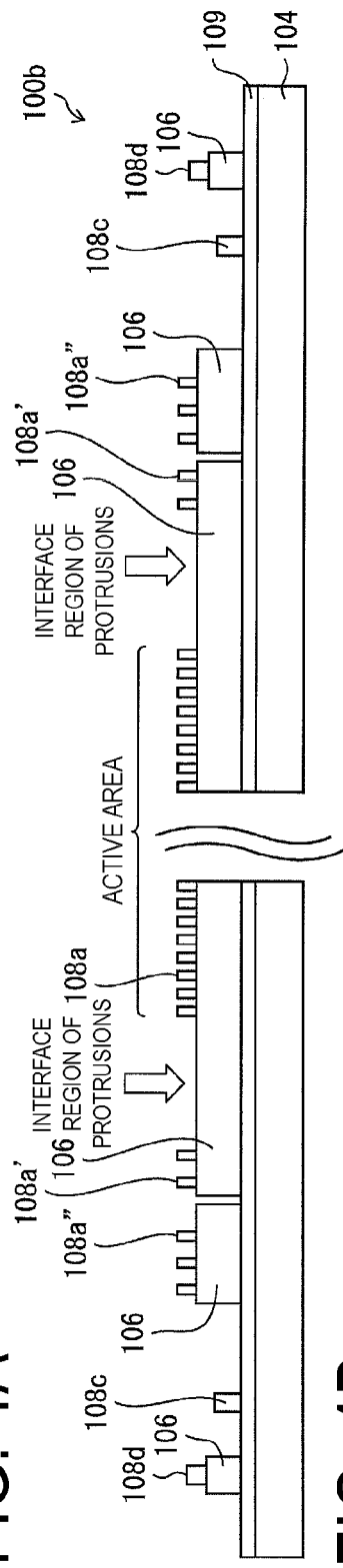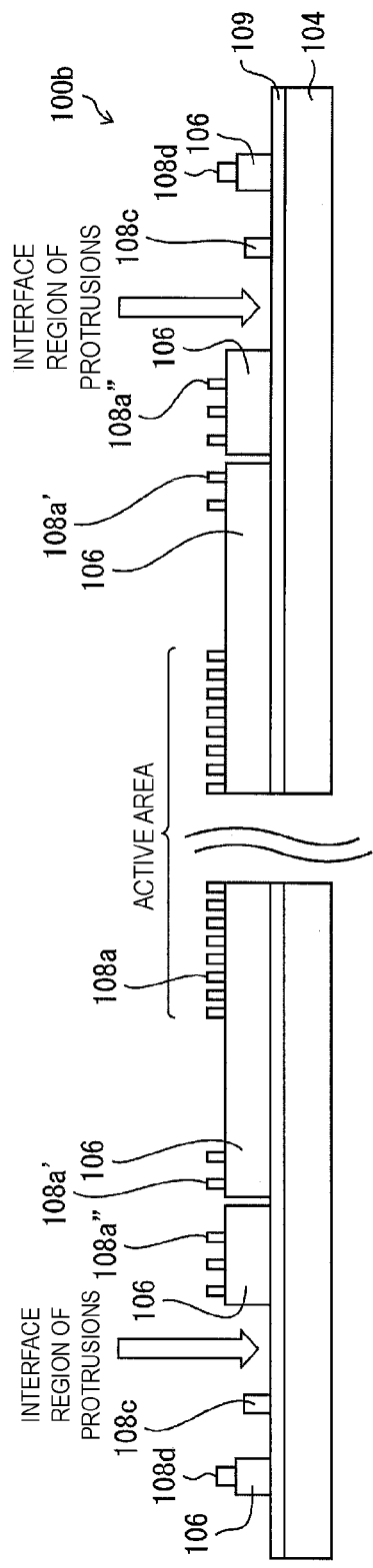

FIG. 5C EXPOSURE 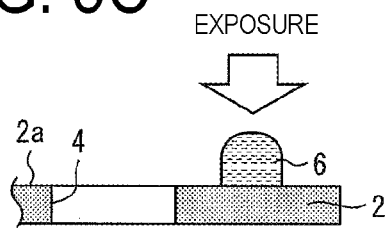

HEAT

FIG. 10A
FIG. 10B
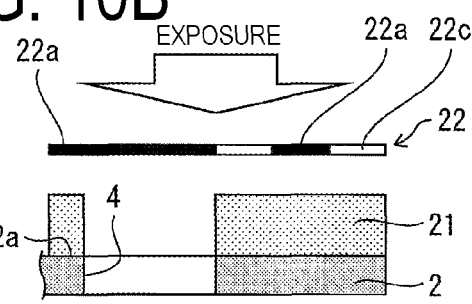
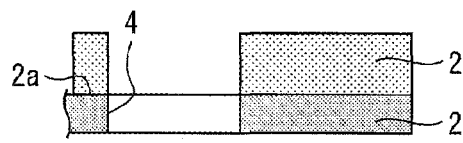
FIG. 10C
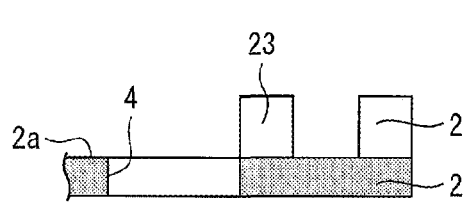
FIG. 10D
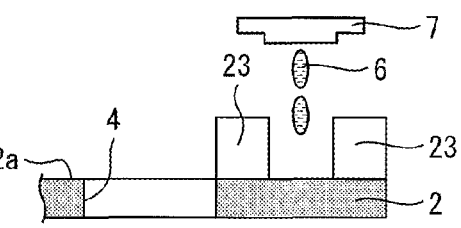
FIG. 10E
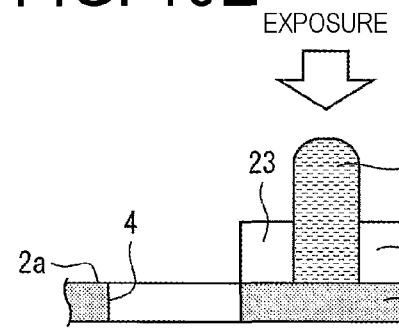
FIG. 10F
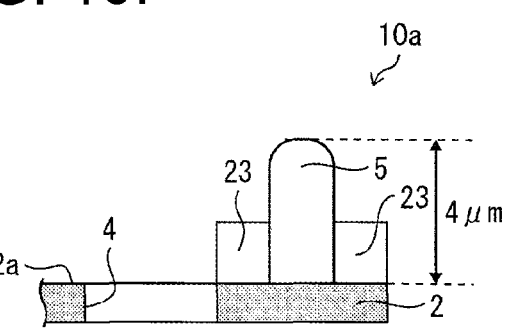

FIG. 14A
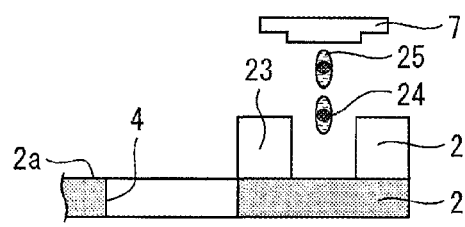
FIG. 14B EXPOSURE
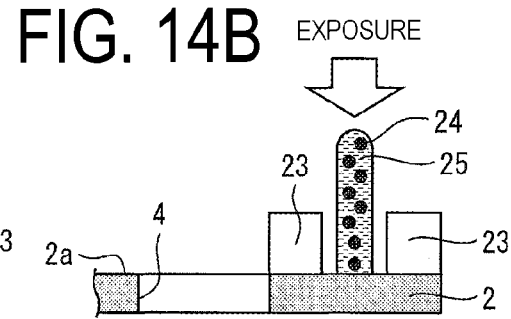
FIG. 14C
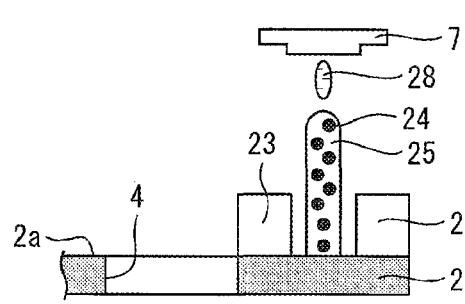
FIG. 14D HEAT
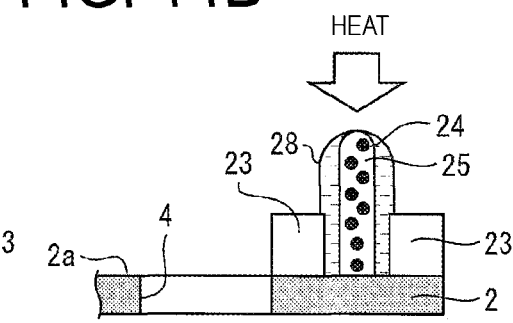
FIG. 14E
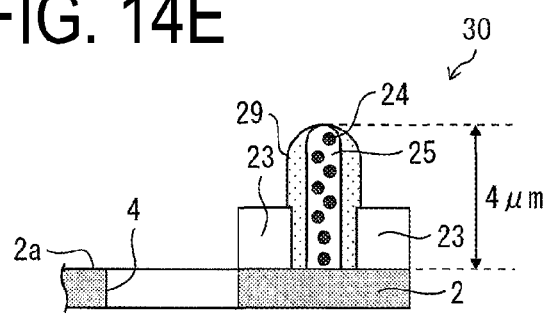

FIG. 15A
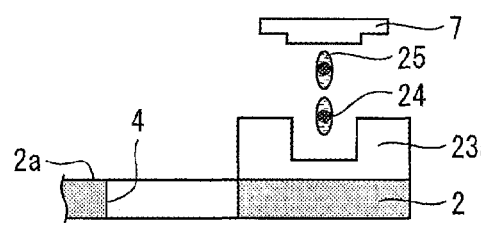
FIG. 15B EXPOSURE
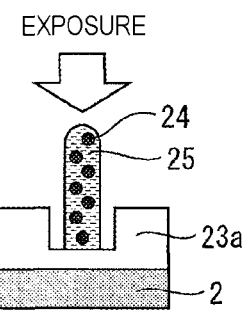
FIG. 15C
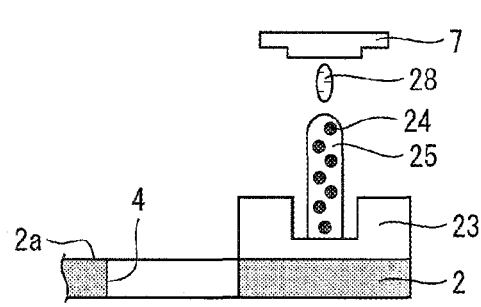
FIG. 15D HEAT
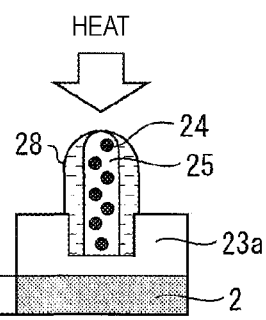
FIG. 15E
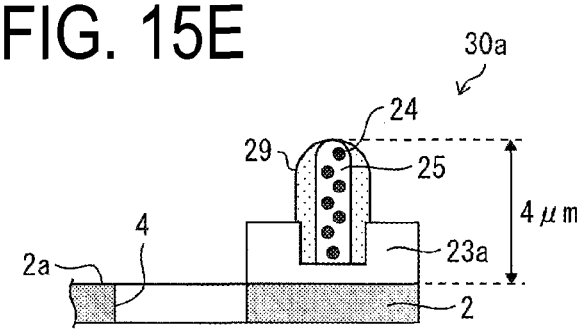

VAPOR DEPOSITION MASK AND MANUFACTURING METHOD FOR ORGANIC EL DISPLAY DEVICE

TECHNICAL FIELD

The present disclosure relates to a vapor deposition mask, a method of manufacturing a vapor deposition mask, and a method of manufacturing an organic EL display device.

BACKGROUND ART

In recent years, a variety of flat panel displays have been developed. In particular, from the viewpoints of achieving low power consumption, thinning, high image quality, and the like, organic (Electroluminescent) EL display devices have attracted significant attention as excellent flat panel displays.

In the manufacturing process of such organic EL display devices, in many cases a separately patterning vapor deposition method is used to form a vapor deposition film that includes a high-definition light emitting layer on a substrate.

When such a separately patterning vapor deposition method is used to carry out a vapor deposition, there can be problems where, when the separately patterning vapor deposition mask and the substrate on which the vapor deposition film is formed are completely adhered to one another when the vapor deposition is performed, then defects may occur in the vapor deposition film after the vapor deposition when separating the separately patterning vapor deposition mask from the substrate. Explaining specifically by way of example, first, after forming a red light-emitting layer on a substrate using a separately patterning vapor deposition mask for forming a red light-emitting layer, in the case where a green light-emitting layer is formed on the substrate by using a separately patterning vapor deposition mask for forming a green light-emitting layer in which an opening is formed at a position different from the separately patterning vapor deposition mask for forming the red light-emitting layer, when the vapor deposition and the substrate on which the red light-emitting layer are completed adhered to one another and vapor deposition is performed, the non-opening portion of the separately patterning vapor deposition mask for forming the green light-emitting layer is in direct contact with the red light-emitting layer on the substrate, such that defects may occur in the red light-emitting layer when separating the separately patterning vapor deposition mask for forming the green light-emitting layer from the substrate.

In order to solve such problems, the following attempts have been made thus far.

FIGS. 18A and 18B are diagrams for explaining a case in which edge covers 108a and 108b having different heights are formed in the same active matrix substrate 100, and the active matrix substrate 100 and the separately patterning vapor deposition mask 101 do not completely adhere to one another as a result of the tall height of the edge cover 108b.

As illustrated in FIG. 18A, an edge cover 108b with a tall height is provided on the surface of the active matrix substrate 100 opposing the separately patterning vapor deposition mask 101, a constant distance can be maintained due to the edge cover 108 such that the active matrix substrate 100 and the separately patterning vapor deposition mask 101 do not completely adhere to one another.

In a state where the active matrix substrate 100 and the separately patterning vapor deposition mask 101 are maintained at a constant distance, the vapor deposition particles emitted from a vapor deposition source (not shown) may be formed in a predetermined shape on the active matrix substrate 100 via the opening 103 of the separately patterning vapor deposition mask 101.

FIG. 18B is a diagram illustrating a schematic configuration of the active matrix substrate 100.

As illustrated in the figures, the active matrix substrate 100 may have a configuration in which a TFT element 105, an interlayer insulating film 106 which is a flattening film, an electrode 107, and edge covers 108a and 108b are provided on a substrate 104.

The primary role of the edge covers (also referred to as banks) is to be formed so as to cover the end portion of the electrode 107 in order to prevent vapor deposition films such as the light emitting layers from being thinly formed at the end portion of the electrode 107 and prevent short circuits from occurring between the electrode 107 and the opposing electrode (not shown). Then, considering that a shared layer (for example, an electrode layer opposing the electrode 107) is formed in a level shape in a subsequent process, it is difficult to form the height of the edge cover to be greater than or equal to a predetermined height.

Accordingly, in the active matrix substrate 100, the edge cover formed at the boundary of the active area in which the plurality of electrodes 107 are regularly formed may be an edge cover 108b with a tall height (a height of 2 µm), and the edge cover formed within the active area may be an edge cover 108a with a low height (a height of 1 µm).

By using the active matrix substrate 100 when performing vapor deposition with the separately patterning vapor deposition method, as the active matrix substrate 100 and the separately patterning vapor deposition mask 101 can be maintained at a constant distance by the edge cover 108b so as not to completely adhere to one another, it is possible to suppress the occurrence of defects in the vapor deposition film such as the light-emitting layer or the like when separating the separately patterning vapor deposition mask 101 from the active matrix substrate 100.

In addition, PTL1 describes a configuration in which a protrusion is provided on the side of a separately patterning vapor deposition mask.

FIG. 19 is a diagram illustrating a schematic configuration of the separately patterning vapor deposition mask 201 disclosed in PTL1.

As illustrated in the figure, the separately patterning vapor deposition mask 201 includes a mask body 202 and a frame body 203, and on a surface of the mask body 202 opposite to the substrate on which the vapor deposition film is to be formed, protrusions 205 are formed between openings 204 adjacent in the vertical direction of the figure.

By using the separately patterning vapor deposition mask 201 when vapor deposition is carried out using the separately patterning vapor deposition method, as the separately patterning vapor deposition mask 201 and the substrate on which the vapor deposition film is to be formed can be prevented from completely adhering to one another, it is disclosed that it is possible to suppress the occurrence of defects in the vapor deposition film such as the light-emitting layer or the like when separating the separately patterning vapor deposition mask 201 from the substrate on which the vapor deposition film is formed.

CITATION LIST

Patent Literature

PTL 1: JP 2003-323980 A (Published Nov. 14, 2003).
PTL 2: JP 10-330910 A (Published Dec. 15, 1998)

SUMMARY

Technical Problem

However, in the active matrix substrate 100 depicted in FIG. 18A and FIG. 18B, as the height of the edge cover 108b with the tall height may be slightly different for each position in the same active matrix substrate 100 or for each active matrix substrate 100, it is difficult to maintain the active matrix substrate 100 and the separately patterning vapor deposition mask 101 at a constant distance using the edge cover 108b provided on the active matrix substrate 100 side.

Additionally, in the case of the separately patterning vapor deposition mask 201 disclosed in PTL1, as illustrated in FIG. 19, the protrusions 205 are formed between the openings 204 adjacent to each other in the vertical direction in the figure on the entire surface opposed to the substrate where the vapor deposition film of the mask body 202 is to be formed.

Accordingly, when such a separately patterning vapor deposition mask 201 is applied to an active matrix substrate having an edge cover, all the protrusions 205 come into contact with the edge cover. In general, however, since the material for forming the edge cover is different from the material for forming the interlayer insulating film 106 depicted in FIG. 18B, which is a flattening film, and, as the film thickness is formed relatively thinly as described above, the upper surface of the edge cover is not particularly flat. Further, as the height of the edge cover may be slightly different for each position in the same active matrix substrate or for each active matrix substrate, the uniformity may be reduced.

Therefore, when the separately patterning vapor deposition mask 201 is applied to an active matrix substrate having an edge cover, as it is difficult to maintain the separately patterning vapor deposition mask 201 and the active matrix substrate having the edge cover at a constant distance, there can be problems where it is difficult to form uniform vapor deposition films on active matrix substrates having edge covers.

Further, in the case where protrusions 205 are formed between the adjacent openings 204 as in the separately patterning vapor deposition mask 201 disclosed in PTL1, the rigidity of the separately patterning vapor deposition mask 201 becomes non-uniform within the surface of the separately patterning vapor deposition mask 201, such that it becomes difficult to bond the mask body 202 to the frame body 203 while finely adjusting the openings 204. Accordingly, it is difficult to form a uniform vapor deposition film on the active matrix substrate via the openings 204 of the separately patterning vapor deposition mask 201.

The present disclosure has been made in view of the above problems, and has a goal of providing a vapor deposition mask capable of forming a uniform vapor deposition film on an active matrix substrate and a method for manufacturing the vapor deposition mask.

Solution to Problem

In order to solve the above problems, a vapor deposition mask of the present disclosure relates to a vapor deposition mask including a substrate provided with a plurality of openings to pass vapor deposition particles, wherein at least a portion of the plurality of openings are structured by one or more opening groups, the plurality of openings being repeatedly arranged in accordance with a constant rule, an opening group formation region is a region in the substrate including at least a plurality of openings belonging to each of the opening groups and a region between adjacent openings of the plurality of openings belonging to each of the opening groups, and a plurality of protrusions of identical height are arranged to support the entire substrate from one side, and are provided only outside the opening group formation region.

According to the above configuration, as the plurality of protrusions of identical height are provided only outside the opening group formation region of the substrate in an arrangement that can support the entire substrate from one side, it is possible to realize a vapor deposition mask capable of forming a uniform vapor deposition film on an active matrix substrate.

In order to solve the above problems, a method for manufacturing a vapor deposition mask of the present disclosure relates to a method for manufacturing a vapor deposition mask provided with a plurality of openings to pass vapor deposition particles, wherein at least a portion of the plurality of openings are structured by one or more opening groups, the plurality of openings being repeatedly arranged in accordance with a constant rule, and an opening group formation region is a region in the substrate including at least a plurality of openings belonging to each of the opening groups and a region between adjacent openings of the plurality of openings belonging to each of the opening groups; the method including forming, only outside the opening group formation region, a plurality of protrusions of identical height with an arrangement to support the entire substrate from one side.

According to the above method, as a process is included for forming a plurality of protrusions of identical height only outside the opening group forming region of the substrate in an arrangement that can support the entire substrate from one side, it is possible to realize a vapor deposition mask manufacturing method capable of forming a uniform vapor deposition film on an active matrix substrate.

Advantageous Effects of Disclosure

According to one aspect of the present disclosure, it is possible to provide a vapor deposition mask capable of forming a uniform vapor deposition film on an active matrix substrate, and a method for manufacturing the vapor deposition mask.

BRIEF DESCRIPTION OF DRAWINGS

FIGS. 4A and 4B are diagrams for describing an interface region of protrusions of the vapor deposition mask depicted in FIG. 3 in an active matrix substrate.

FIGS. 5A to 5D are diagrams illustrating an example of a method of manufacturing the vapor deposition mask depicted in FIG. 1.

FIGS. 10A to 10F are diagrams illustrating an example of a manufacturing method of a vapor deposition mask in which protrusions are formed within a recess.

FIGS. 14A to 14E are diagrams illustrating an example of a method of manufacturing a vapor deposition mask in which a layer covering the protrusions is further formed after the protrusions made of a material including beads are formed in the recess.

FIGS. 15A to 15E are diagrams illustrating another example of a method of manufacturing a vapor deposition mask in which a layer covering the protrusions is formed after the protrusions made of a material including beads are formed in the recess.

DESCRIPTION OF EMBODIMENTS

Figure 1:
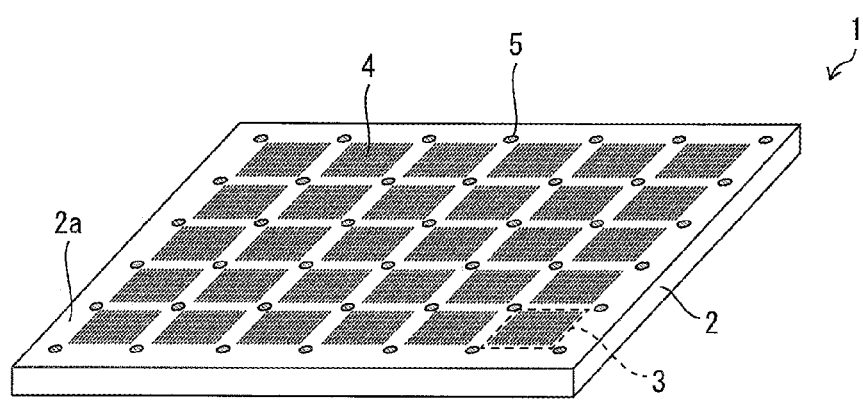
FIG. 1 is a diagram illustrating an example of a vapor deposition mask provided with a plurality of protrusions outside of an opening group formation region.

Embodiments of the present disclosure will be described with reference to FIG. 1 to FIGS. 17A to 17C. In the following, for convenience of description, components having the same function as components described in specific embodiments will be denoted by the same reference numerals, and the description thereof may be omitted.

First Embodiment

A first embodiment of the present disclosure will be described with reference to FIG. 1 to FIGS. 9A to 9C.

FIG. 1 is a diagram illustrating a vapor deposition mask 1 in which a plurality of protrusions 5 are provided outside an opening group formation region 3.

In the present embodiment, although description is provided of an example of a case where the vapor deposition mask 1 is a metallic mask which does not experience deformation or the like at the temperature of the vapor deposition film formation step, the material of the mask is not particularly limited.

As illustrated in FIG. 1, the vapor deposition mask 1 may include a metallic substrate 2 provided with a plurality of openings 4 (also referred to as through-holes) to pass vapor deposition particles. The plurality of openings 4 in the opening group formation region 3 may be arranged in accordance with a constant rule, and a plurality of opening group formation regions 3 may be formed in the metal substrate 2.

In addition, when manufacturing organic EL display devices, in order to manufacture at a lower cost, there are cases where a method is used in which a plurality of sub-substrates (for example, 5 inches) are simultaneously formed on a large base substrate, and cut out to form the individual sub-substrates. The opening group formation region 3 is a mask region corresponding to these sub-substrates.

In the present embodiment, although an example is provided of a case where 30 opening group formation regions 3 are formed, the number of the opening group formation regions 3 can be appropriately set in accordance with the size of one opening group formation region 3 and the size of the vapor deposition mask 1, and may be one.

It should be noted that the size of one opening group formation region 3 may correspond to the size of a display region of one of the 30 organic EL display devices of the 30 organic EL display devices obtained by dividing the active matrix substrate including the vapor deposition film deposited using the vapor deposition mask 1.

In addition, in the present embodiment, as description is provided of an example of a case where the evaporation mask 1 is a red light-emitting layer, the arrangement of the plurality of openings 4 in each opening group formation region 3 of the vapor deposition mask 1 is arranged in accordance with the shape of the red light-emitting layer of the 30 organic EL display devices obtained by dividing the active matrix substrate including the vapor deposition film deposited using the vapor deposition mask 1.

In the present embodiment, as described below, the red pixels of the red light-emitting layer, the green pixels of the green light-emitting layer, and the blue pixels of the blue light-emitting layer are vapor deposition masks used for manufacturing an organic EL display device that forms one pixel. As such, although an example is described of a case where the arrangement of the plurality of openings 4 in the opening group formation region 3 is arranged is based on the arrangement of the pixels in accordance with a constant rule, it goes without saying that the arrangement of the plurality of openings 4 in the opening group formation region 3 may be arranged accordingly in cases where each color pixel is in a Pentile arrangement, another arrangement, or the size of each color pixel is different.

As illustrated in FIG. 1, in the vapor deposition mask 1, a plurality of protrusions 5 are formed on a surface 2a opposed to the active matrix substrate (not shown) outside the opening group formation region 3. In the case of the vapor deposition mask 1, although the protrusions 5 are provided at the four corner portions of the opening group formation region 3, as described later, provided the arrangement can support the entire vapor deposition mask from one side, the present disclosure is not limited herein.

Figure 2A:
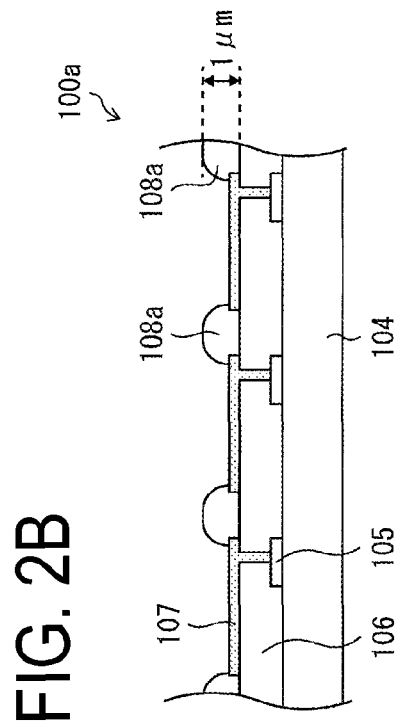
FIGS. 2A to 2C are diagrams for describing a case where vapor deposition is performed using the vapor deposition mask depicted in FIG. 1.
Figure 2B:
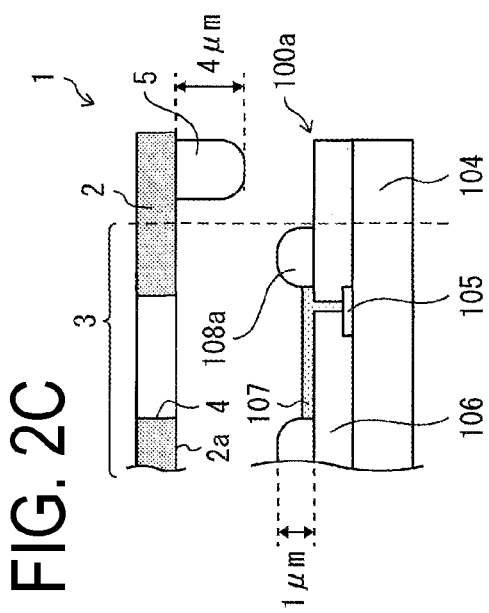
Figure 2C:
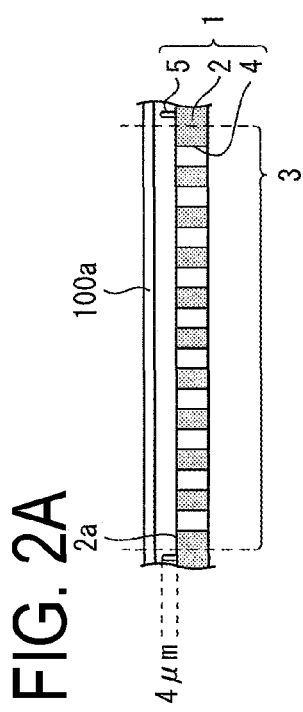

FIGS. 2A to 2C is a diagram for describing a case where a vapor deposition film is formed on the active matrix substrate 100a using the vapor deposition mask 1 depicted in FIG. 1.

As illustrated in FIG. 2A, in the vapor deposition mask 1, each of the plurality of protrusions 5 may be arranged on a surface 2a opposed to the active matrix substrate 100a and outside the opening group formation region 3 with a height of 4 μm so as to support the entire vapor deposition mask 1 from one side (the active matrix substrate 100a side).

Accordingly, a 4 μm distance can be secured between the surface 2a opposed to the active matrix substrate 100a of the vapor deposition mask 1 and the surface of the active matrix substrate 100 opposed to the vapor deposition mask 1. Note that FIG. 2A does not depict the entire vapor deposition mask 1 and the active matrix substrate 100a, but only depicts a portion corresponding to one opening group formation region 3.

In the present embodiment, although a case in which the protrusions 5 are formed with a height of 4 μm was described as an example, it may be preferable that the height of the protrusions 5 be formed to be more than 2 μm and less than 5 μm for the reasons described below. In the case that the height of the protrusions 5 are formed to be 2 μm or less, the risk of contact between the vapor deposition mask 1 and the active matrix substrate 100a increases, and in the case that the height of the protrusions 5 are formed to be 5 μm or more, blurring may occur in the actual vapor deposition pattern, such that the vapor deposition accuracy is lowered.

As illustrated in FIG. 2A, a constant distance can be maintained by the protrusions 5 such that the active matrix substrate 100a and the vapor deposition mask 1 do not completely adhere to each other.

Next, in a state where the active matrix substrate 100a and the vapor deposition mask 1 are maintained at a constant distance, the vapor deposition particles emitted from the vapor deposition source (not shown) may be formed in a predetermined shape on the active matrix substrate 100a via the openings 4 of the vapor deposition mask 1, such that a uniform vapor deposition film can be formed on the active matrix substrate 100a.

In a case where a vapor deposition mask 1 provided with the protrusions 5 is used, as the active matrix substrate 100a and the vapor deposition mask 1 can be maintained at a constant distance by the projections 5 of the vapor deposition mask 1, as illustrated in FIG. 2B, for example, only edge covers 108a with a height of 1 μm may be provided on the active matrix substrate 100a.

In addition, as illustrated in FIG. 2C, the active region of the active matrix substrate 100a which overlaps with the opening group formation region 3 of the vapor deposition mask in a plan view may be a region including an electrode 107 and the edge cover 108a.

In the vapor deposition mask 1, as the plurality of projections 5 are provided outside the opening group formation region 3, the projections 5 of the vapor deposition mask 1 do not come into contact with the active region of the active matrix substrate 100a, and are in contact with the upper surface of the interlayer insulating film 106, which is a flattening film of the active matrix substrate 100a.

Accordingly, by using the vapor deposition mask 1, the active matrix substrate 100a and the vapor deposition mask 1 can be maintained at a constant distance with high accuracy.

Figure 3:
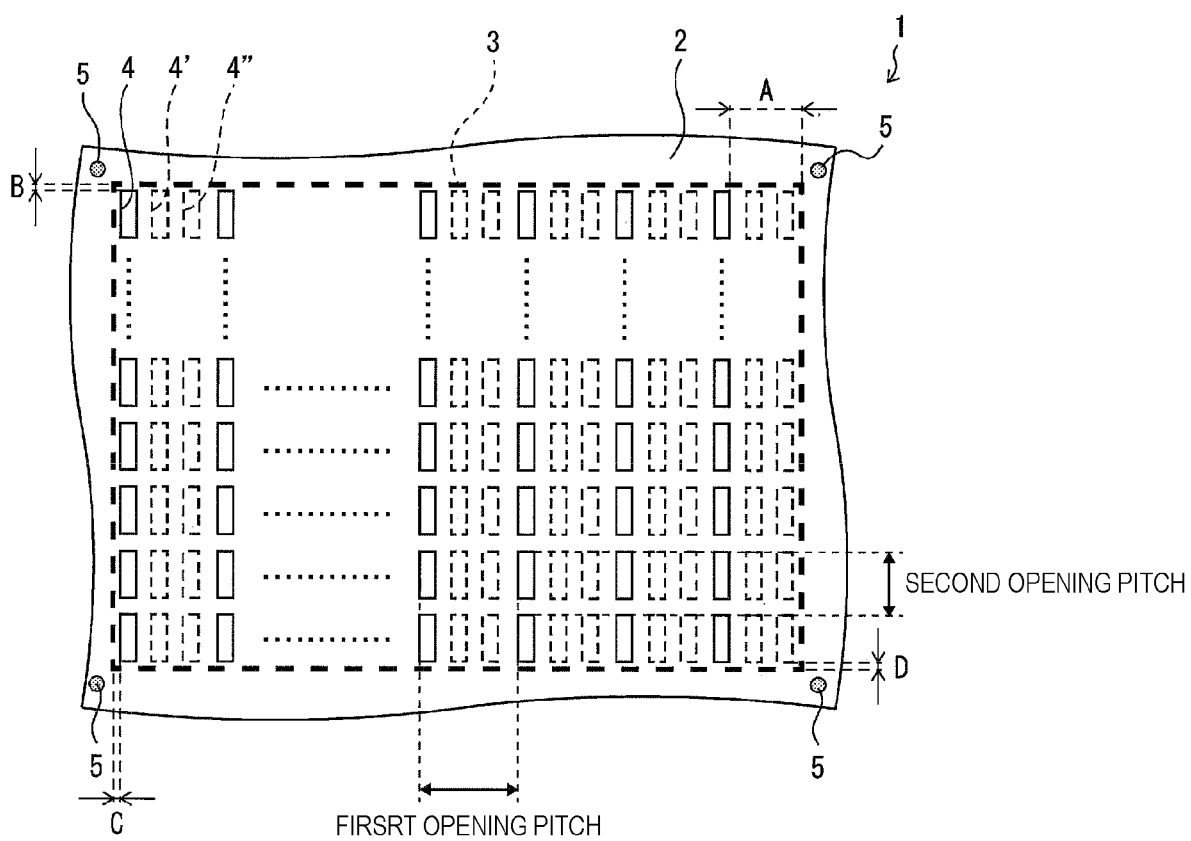
FIG. 3 is a partially enlarged view of an opening group formation region of the vapor deposition mask depicted in FIG. 1.

FIG. 3 is a partially enlarged view of an opening group formation region 3 of the vapor deposition mask 1.

As illustrated in FIG. 3, in the vapor deposition mask 1, as the red pixels of the red light-emitting layer, the green pixels of the green light-emitting layer, and the blue pixels of the blue light-emitting layer are vapor deposition masks used for manufacturing an organic EL display device that forms one pixel, the plurality of openings 4 of the opening group formation region 3 may be formed with a first opening pitch in the horizontal direction of the figures and with a second opening pitch in the vertical direction of the figures.

Note that the opening 4' indicated by the dotted line in the figures is an opening present in the vapor deposition mask of the green light-emitting layer used for manufacturing the organic EL display device in which the red pixels of the red light-emitting layer, the green pixels of the green light-emitting layer, and the blue pixels of the blue light-emitting layer form one pixel, and is an imaginary opening that does not exist in the vapor deposition mask 1. In addition, the opening 4" indicated by the dotted light in the figures is also an opening present in the vapor deposition mask of the blue light-emitting layer used for manufacturing the organic EL display device in which the red pixels of the red light-emitting layer, the green pixels of the green light-emitting layer, and the blue pixels of the blue light-emitting layer form one pixel, and is an imaginary opening that does not exist in the vapor deposition mask 1.

As illustrated in FIG. 3, the opening group formation region 3 may be a region including at least a plurality of openings 4, a region between each of the openings 4 in the horizontal direction of the figures, and a region between each of the openings 4 in the vertical direction of the figures. In the present embodiment, however, in order to prevent the protrusions 5 from coming into contact with the edge covers of active matrix substrates with more diverse shapes, the right end of the opening group formation region 3 may be widened by a width A from the right end of the opening 4 located at the right end within the opening group formation region 3, the upper end of the opening group formation region 3 may be widened by a width B from the upper end of the opening 4 located at the upper end within the opening group formation region 3, the left end of the opening group formation region 3 may be widened by a width C from the left end of the opening 4 located at the left end within the opening group formation region 3, and the lower end of the opening group formation region 3 may be widened by a width D from the lower end of the opening 4 located at the lower end within the opening group formation region 3. No protrusions 5 are provided within the expanded opening group formation region 3.

As described above, when considering the edge covers 108a arranged at the upper, lower, left, and right end portions, by establishing the opening group formation 3, contact between the edge covers 108 arranged at the upper, lower, left, and right end portions and the plurality of protrusions 5 arranged outside the opening group formation region 3 may be prevented, and the protrusions 5 can be brought into contact with the upper surface of the interlayer insulating film 106, which is a flattening film of the active matrix substrate 100a.

FIG. 4 is a diagram for describing an interface region of the protrusions 5 of the vapor deposition mask 1 depicted in FIG. 3 in the active matrix substrate 100b.

As illustrated in FIG. 4A, the active matrix substrate 100b may have a configuration in which an inorganic film 109, an interlayer insulating film 106 which is a flattening film included in a formation layer of a TFT element (not shown)

which is an active element, edge cover 108a, and the projections 108a', 108a", 108c, and 108d are formed on the substrate 104.

In particular, the edge cover 108a may be provided on the interlayer insulating film 106, which is a flattening film, in the active area (display region), the projection 108a' may be provided outside the active area adjacent to the edge cover 108a on the interlayer insulating film 106, which is a flattening film, the projection 108a" may be provided on the interlayer insulating film 106, which is a flattening film, adjacent to the protrusion 108a', the projection 108c may be provided in the opening formed by the interlayer insulating film 106, which is a flattening film, provided on the inorganic film 109, and the projection 108d may be provided on the interlayer insulating film 106, which is a flattening film.

As illustrated in the figures, the protrusions 5 of the vapor deposition mask 1 may be interfaced with the interlayer insulating film 106 in the interface region of the protrusions in the figure of the active matrix substrate 100b.

As the interface region of the protrusions 5 depicted in FIG. 4A are nearby to the opening group formation region 3 of the vapor deposition mask 1 depicted in FIG. 3, the gap between the vapor deposition mask 1 and the active matrix substrate 100b can be reliably secured.

Note that although the protrusions 5 of the vapor deposition mask 1 may be interfaced with the active matrix substrate 100b in the interface region of the protrusions 5 depicted in FIG. 4A, the present disclosure is not limited herein, and the protrusions 5 may be interfaced with the active matrix substrate 100b in the interface region of the protrusions 5 illustrated in FIG. 4B.

The interface region of the protrusions 5 depicted in FIG. 4B may be a region regulated by the projection 108c and the interlayer insulating film 106, which is a flattening film, within the opening formed by the interlayer insulating film 106, which is a flattening film. In this interface region of the protrusions 5, the protrusions 5 of the vapor deposition mask 1 may interface with the inorganic film 109 as an insulating film formed below the interlayer insulating film 106, which is a flattening film, included in the formation layer of the TFT element (not shown) in the active matrix substrate 100b.

In this way, when the protrusions 5 of the vapor deposition mask 1 are interfaced with the inorganic film 109 on the active matrix substrate 100b, the gap between the vapor deposition mask 1 and the active substrate 100b can be made smaller.

In addition, as the height of the protrusions 5 increase, since the size of the vapor deposition film formed on the active matrix substrate 100a side is larger than the size of the openings 4, the opening group formation region 3 in cases where the height of the protrusions 5 is tall may preferably be set wider than the opening group formation region 3 when the height of the protrusions 5 is short.

As illustrated in FIG. 1 and FIG. 3, the plurality of openings 4 in the vapor deposition mask 1 may be structured from 30 groups of openings in which the openings 4 are repeatedly arranged in accordance with a constant rule, and as the region that includes each of the 30 opening groups is the opening group formation region 3, there are 30 opening group formation region 3 in the vapor deposition mask 1.

Each of the opening group formation regions 3 is a region corresponding to an active region, which is a display area of each of the 30 organic EL display devices obtained by dividing the active matrix substrate that includes the vapor deposition film deposited using the vapor deposition mask 1. In particular, as illustrated in FIG. 2C, each of the opening group formation regions 3 is a region including a region where the electrode 107 and the edge cover 108a are formed in the active matrix substrate 100a.

In the present embodiment, as described below, although an example is described of a case in which a plurality of protrusions 5 are formed on a surface 2a of a metal substrate 2 opposed to the active matrix substrate 100a and outside the opening group formation region 3 using a resin material different from the metal substrate 2, the present disclosure is not limited herein, and, for example, the protrusions 5 may be formed of the same material as the metal substrate 2 or a metal material different from the metal substrate 2, by electroforming or the like.

FIGS. 5A to 5D are diagrams illustrating a method of manufacturing a vapor deposition mask 1 provided with protrusions 5 formed by performing an exposure process after dripping a photo-curable resin material 6 using an ink-jet dripping device 7.

Figure 5A:
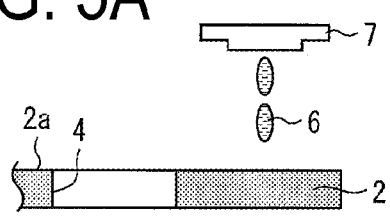

First, as illustrated in FIG. 5A, in a metal substrate 2 provided with a plurality of openings 4 to pass vapor deposition particles, the photo-curable resin material 6 may be dripped using the ink-jet dripping device 7 onto a predetermined position on the surface 2a opposed to the active matrix substrate and outside the opening group formation region 3.

In the present embodiment, for example, a photo-curable resin material formed by dissolving an acrylic resin (acrylic polymer) including polymethyl methacrylate or the like and a photoinitiator in a predetermined solvent and adjusted to have a viscosity which can be used in the ink-jet dripping device 7 and that is also a viscosity that allows for film thickness adjustment on the metal substrate 2 in accordance with the drip amount was used as the photo-curable resin material 6.

Figure 5B:
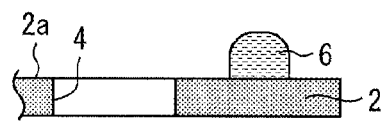

As illustrated in FIG. 5B, as the photo-curable resin material 6 is adjusted to have a viscosity that allows for film thickness adjustment, it can be formed to a constant film thickness in accordance with the drip amount, without widely spreading on the metal substrate 2. Note that, in the present embodiment, after the photo-curable resin material 6 is formed to have a constant film thickness, pre-baking (heat treatment) was performed at a relatively low temperature in order to remove the solvent, but this pre-bake need not be performed.

Figure 5D:
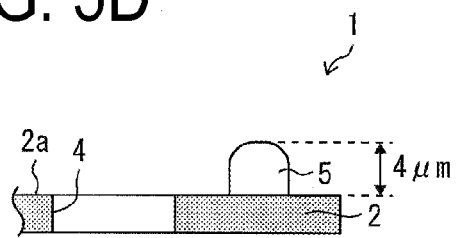

Then, as illustrated in FIG. 5C, exposure may be performed using light in a wavelength region where the photoinitiator initiates a reaction, and the photo-curable resin material 6 may be photocured. As illustrated in FIG. 5D, protrusions 5 with a height of 4 μm may be formed on the outer side of the opening group formation region 3 on the surface 2a of the metal substrate 2 opposite to the active matrix substrate.

Note that, in addition to the acrylic resin and the photoinitiator, it is preferable that the photo-curable resin material 6 further includes, for example, at least one of an epoxy resin (epoxy polymer) which is a thermosetting resin or a siloxane polymer as well as a thermal acid generator as a polymerization initiator in order to increase the strength and the like of the protrusions 5. In such a case, post-baking (heat treatment) performed at a relatively high temperature may be performed in order to thermally cure the thermosetting resin.

In addition, considering that the vapor deposition mask 1 is a mask used in the vapor deposition process, even when a thermosetting resin is not included in the photo-curable resin material 6, it is preferable for post-baking (heat treatment) at a relatively high temperature to be performed. The temperature of the post-baking (heat treatment) may preferably be set higher than the temperature at which the vapor deposition mask 1 is used in the vapor deposition process. This is because, in the case of organic films which do not undergo post-baking (heat treatment) performed at a relatively high temperature, there is a risk that the film thickness changes in the vapor deposition step.

Note that the temperature of the post-baking (heat treatment) may be configured to change in stages. In this case, in at least one stage of the multiple stages, it is preferable to set the temperature higher than the temperature at which the vapor deposition mask 1 is used in the vapor deposition process.

In addition, before dripping the photo-curable resin material 6 onto the surface 2a of the metal substrate 2 opposed to the active matrix substrate, the surface 2a of the metal substrate 2, which opposes the active matrix substrate, may be treated with a silane coupling agent or the like to improve adhesion between the metal and the organic film, for example.

Figure 6A:
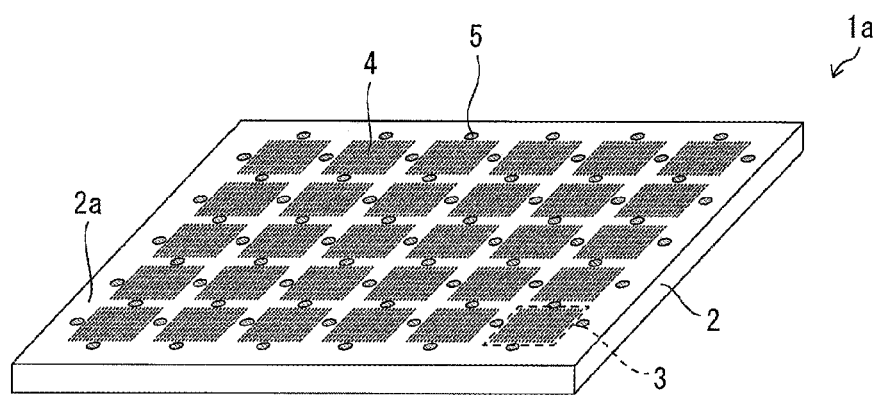
FIGS. 6A and 6B are diagrams illustrating an example of another vapor deposition mask in which protrusions are arranged at different positions from those of the vapor deposition mask depicted in FIG. 1.
Figure 6B:
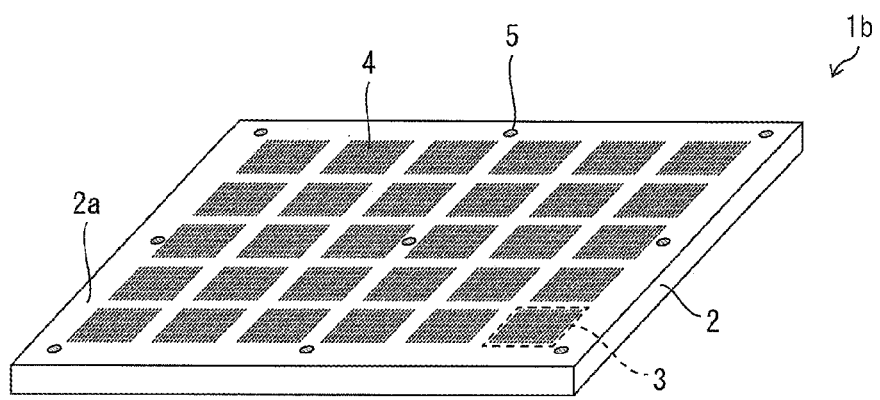

FIGS. 6A and 6B are diagrams illustrating vapor deposition masks 1a and 1b in which the protrusions 5 are arranged at different positions from the vapor deposition mask 1 depicted in FIG. 1.

In the vapor deposition mask 1 depicted in FIG. 1, the protrusions 5 are provided at the four corner portions of the opening group formation region 3, but as illustrated in FIG. 6A, the protrusions 5 may be provided outside the opening group formation region 3 and nearby an intermediate position between the four sides of the opening group formation region 3. Further, as illustrated in FIG. 6B, when the 15 opening group formation regions 3 on the left side of the figure are regarded as large first opening group formation regions and the 15 opening group formation regions 3 on the right side of the figure are regarded as large second opening group formation regions, the protrusions 5 may be provided at each of the four corner portions of each of the first opening group formation region and the second opening group formation region, as well as both ends of the intermediate portion in the vertical direction.

As described above, the arrangement of the protrusions 5 is not particularly limited, provided it is outside the opening group formation region 3 and can support the entire vapor deposition mask 1, 1a, and 1b from one side.

Although an example was described of a case where the protrusions 5 are formed through an exposure process after dripping the photo-curable resin material 6 using the ink-jet dripping device 7, the protrusions 5 of the vapor deposition mask 1 may be formed through a heat treatment process after a thermosetting resin material 8 is dripped using the ink-jet dripping device 7.

FIGS. 7A to 7D are diagrams illustrating a method of manufacturing a vapor deposition mask 10 provided with projections 9 formed by a heat treatment process after a thermosetting resin material 8 is dripped using the ink-jet dripping device 7.

First, as illustrated in FIGS. 7A to 7D, in a metal substrate 2 provided with a plurality of openings 4 to pass vapor deposition particles, the thermosetting resin 8 may be dripped using the ink-jet dripping device 7 onto a predetermined position on the surface 2a opposed to the active matrix substrate and outside the opening group formation region 3.

In the present embodiment, for example, a thermosetting resin material formed by dissolving at least one of an epoxy resin (epoxy polymer) and a thermal acid generator as a polymerization initiator in a predetermined solvent and adjusted to have a viscosity which can be used in the ink-jet dripping device 7 and that is also a viscosity that allows for film thickness adjustment on the metal substrate 2 in accordance with the drip amount was used as the thermosetting resin material 8.

Figure 7A:
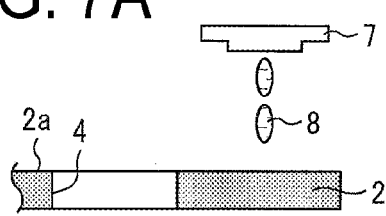
FIGS. 7A to 7D are diagrams illustrating an example of another method of manufacturing a vapor deposition mask.
Figure 7B:
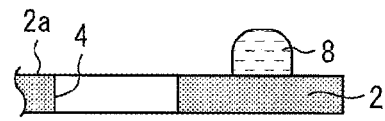

As illustrated in FIG. 7B, as the thermosetting resin material 8 is adjusted to have a viscosity that allows for film thickness adjustment, it can be formed to a constant film thickness in accordance with the drip amount, without widely spreading on the metal substrate 2.

Figure 7C:
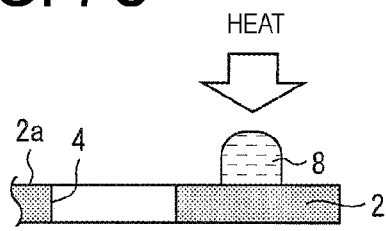
Figure 7D:
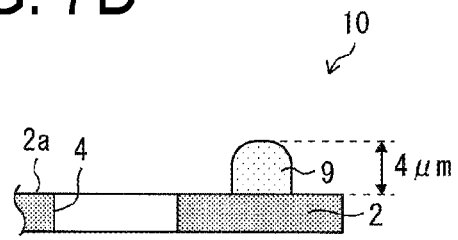

Then, as illustrated in FIG. 7C, heat treatment is performed at or above the temperature in which the thermal acid generator starts polymerization in order to remove the solvent and heat-cure the thermosetting resin material 8, and as illustrated in FIG. 7D, a vapor deposition mask 10 having protrusions 9 with a height of 4 μm is completed on the outer side of the opening group formation region 3 on the surface 2a of the metal substrate 2 opposed to the active matrix substrate.

In addition, considering that the vapor deposition mask 10 is a mask used in the vapor deposition process, the temperature of the heat treatment illustrated in FIG. 7C may preferably be set higher than the temperature at which the vapor deposition mask 10 is used in the vapor deposition process. This is because, in the case of films which do not undergo heat treatment performed at a relatively high temperature, there is a risk that the film thickness changes in the vapor deposition step.

Note that the temperature of the heat treatment illustrated in FIG. 7C may be configured to change in stages. In this case, in at least one stage of the multiple stages, it is preferable to set the temperature higher than the temperature at which the vapor deposition mask 10 is used in the vapor deposition process.

In addition, before dripping the thermosetting resin material 6 onto the surface 2a of the metal substrate 2 opposed to the active matrix substrate, the surface 2a of the metal substrate 2, which opposes the active matrix substrate, may be treated with a silane coupling agent or the like to improve adhesion between the metal and the organic film, for example.

In addition, in cases where it is anticipated that the deposition mask 10 will be used at a relatively high temperature in the vapor deposition process, in the thermosetting resin material 8, it is preferable to increase the content of the siloxane polymer, which is an organic-inorganic hybrid material that forms a film having a high heat-resistance after heat-curing.

In the following, a case will be described with reference to FIGS. 8A to 8C in which protrusions 12 of a vapor deposition mask 13 are formed without using the ink-jet dripping device 7.

Figure 8A:
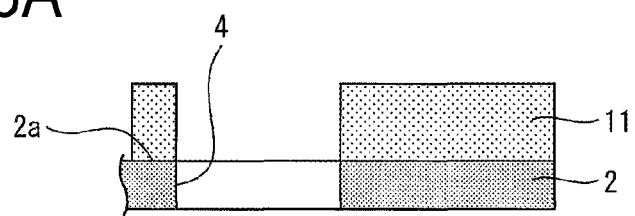
FIGS. 8A to 8C are diagrams illustrating an example of still another method of manufacturing a vapor deposition mask.
Figure 8B:
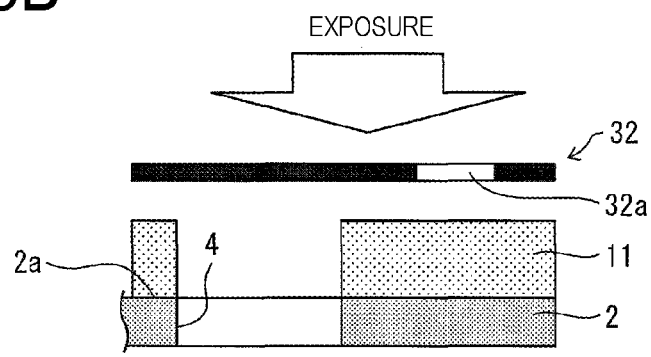
Figure 8C:
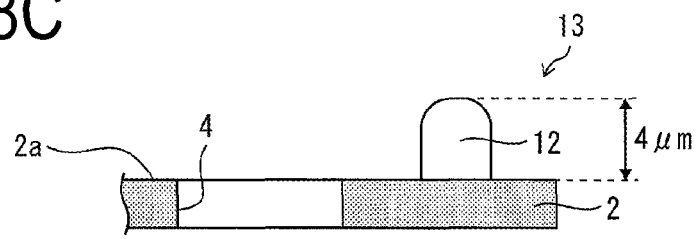

FIGS. 8A to 8C are diagram illustrating a method of using a slit coater to manufacture a vapor deposition mask 13 provided with protrusions 12 formed through an exposure/development process after applying a photo-curable resin material 11 to the surface 2a of the metal substrate 2 opposing the active matrix substrate.

First, as illustrated in FIG. 8A, the photo-curable resin material 11 may be applied using a slit coater (not shown) to the entire surface of the surface 2a opposed to the active matrix substrate of the metal substrate 2, with the exception of the opening 4 portion.

As a slit coater is used in place of the ink-jet dripping device 7, since it is not necessary to adjust the viscosity according to the drip amount such that the film thickness can be adjusted on the metal substrate 2 as in the case of using the ink-jet dripping device 7, the range of viscosity adjustment of the photo-curable resin material 11 may increase.

In the present embodiment, although a negative type photo-curable resin material formed by dissolving an acrylic resin (acrylic polymer) including polymethyl methacrylate or the like and a photoinitiator in a predetermined solvent and photo-curing an exposed portion was used as the photo-curable resin material 11, the present disclosure is not limited thereto, and a positive photo-curable resin material may be used.

In addition, in the present embodiment, although an example was described of a case in which a slit coater was used, the present disclosure is not limited thereto. In consideration of the size of the openings 4, the arrangement of the openings 4, and the like, a method capable of uniformly coating the photo-curable resin material 11 on the entire surface with the exception of the opening 4 portion of the surface 2a opposed to the active matrix substrate of the metal substrate 2 can be appropriately selected. For example, a screen printing method, a spin coater, or the like may be used.

As illustrated in FIG. 8C, a vapor deposition mask 13 provided with protrusions 12 having a height of 4 μm may be completed outside the opening group formation region 3 on the surface 2a opposed to the active matrix substrate of the metal substrate 2 by performing exposure, development, and heat treatment using a mask 32 having an opening 32a as illustrated in FIG. 8B.

Although the above-mentioned heat treatment can be omitted, considering that the vapor deposition mask 13 is a mask used in the vapor deposition process, it is preferable to perform the above-mentioned heat treatment, and it may be preferable that the temperature of the heat treatment is set higher than the temperature at which the vapor deposition mask 13 is used in the vapor deposition process. In addition, the temperature of the heat treatment may be configured to change in stages. In this case, in at least one stage of the multiple stages, it is preferable to set the temperature higher than the temperature at which the vapor deposition mask 13 is used in the vapor deposition process.

In addition, before applying the photo-curable resin material 11 on the surface 2a of the metal substrate 2 opposed to the active matrix substrate, the surface 2a of the metal substrate 2, which opposes the active matrix substrate, may be treated with a silane coupling agent or the like to improve adhesion between the metal and the organic film, for example.

Figure 9A:
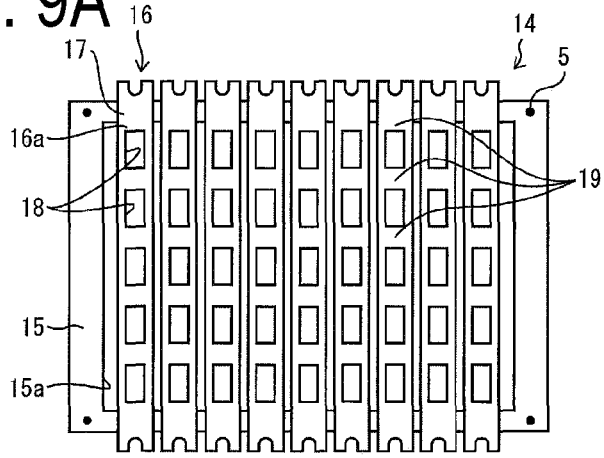
FIGS. 9A to 9C are diagrams illustrating an example of a case where protrusions are formed on a vapor deposition mask having a shape different from that of the vapor deposition mask depicted in FIG. 1.
Figure 9B:
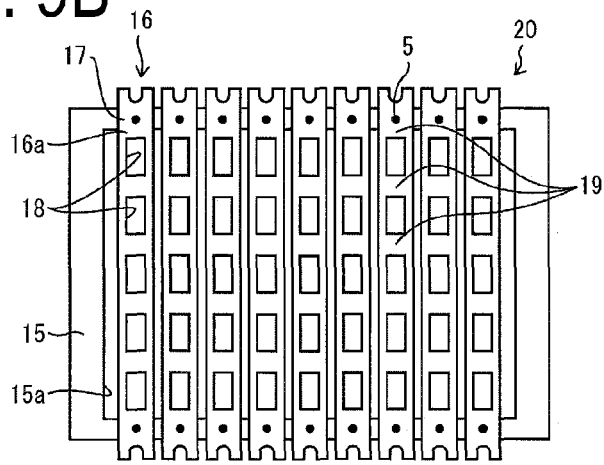
Figure 9C:
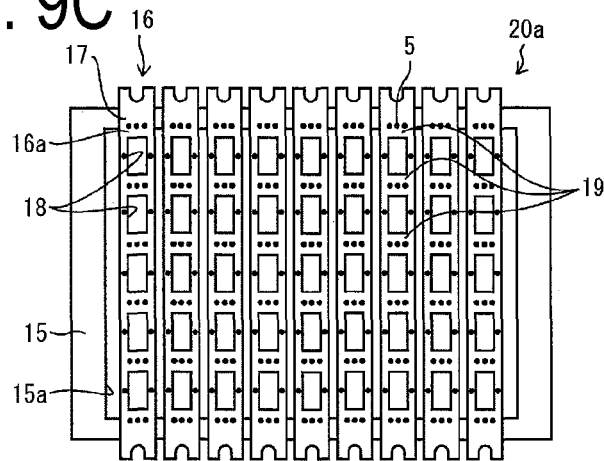

FIGS. 9A to 9C are diagram illustrating vapor deposition masks 14, 20, and 20a, which include a plurality of divided masks 16 and are provided with projections 5.

In the vapor deposition masks 14, 20, and 20a depicted in FIG. 9A, FIG. 9B, and FIG. 9C, a plurality of divided masks 16 are fixed (stretched) in a state in which tension is applied to a frame 15 having a large opening 15a in a center portion, and the opening group formation region 18 in each of the plurality of divided masks 16 is arranged so as to overlap with the large opening 15a in the central portion of the frame 15 in a plan view.

Each of the plurality of divided masks 16 is composed of a metal plate 17 such as an Invar material, for example, and a surface 16a on one side of the divided mask 16 is a surface opposed to the active matrix substrate.

Each of the plurality of divided masks 16 may include a plurality of opening group formation regions 18 similar to the opening group formation regions 3 illustrated in FIG. 3, and in the metal plate 17, a region other than the opening group formation region 18 may be a surrounding region 19.

In the vapor deposition mask 14 depicted in FIG. 9A, protrusions 5 with a height of 4 μm are provided at the four corner portions of the frame 15 outside the opening group formation region 18. It should be noted that the arrangement positions of the protrusions 5 are not limited thereto. For example, the protrusions 5 may be arranged at regular intervals along the shape of the frame 15 with the exception of the portion where the divided masks 16 are fixed.

Note that, in the vapor deposition mask 14, as the protrusions 5 are provided on the frame 15, the distance between the frame 15 and the active matrix substrate is maintained at 4 μm, but in the case that it is desirable to maintain the distance between the divided masks 16 and the active matrix substrate at 4 μm, protrusions 5 having a height of 4 μm may be provided on the divided masks 16, or projections 5 having a height obtained by adding the thickness of the divided mask 16 may be provided on the frame 15, as depicted in FIG. 9B and FIG. 9C to be described later.

In addition with respect to the protrusions 5, before the plurality of divided masks 16 are fixed to the frame 15; that is, after first providing the protrusions 5 on the frame 15 alone, the plurality of divided masks 16 may be fixed to the frame 15, or the protrusions 5 may be provided on the frame 15 after fixing the plurality of divided masks 16 to the frame 15.

In the vapor deposition mask 14 depicted in FIG. 9A, although the protrusions 5 were formed using the same method as the method illustrated in FIGS. 5A to 5D, the present disclosure is not limited thereto, and an appropriate selection can be made in consideration of the material of the frame 15 and the material of the protrusions 5.

In the vapor deposition mask 20 depicted in the FIG. 9B, the protrusions 5 are provided near both ends each of the plurality of divided masks 16 in the vertical direction of the figure. In the case of the vapor deposition mask 20, as the protrusions 5 are provided on the divided masks 16, the distance between the divided masks 16 and the active matrix substrate can be maintained at a predetermined distance.

In addition with respect to the protrusions 5, in the case of the vapor deposition mask 20, before the plurality of divided masks 16 are fixed to the frame 15; that is, after first providing the protrusions 5 to the divided masks 16 alone, the plurality of divided masks 16 may be fixed to the frame 15, or the protrusions 5 may be provided on the divided masks 16 after the plurality of divided masks 16 are fixed to the frame 15.

In the vapor deposition mask 20a depicted in FIG. 9C, the protrusions 5 may be provided on the surface 16a opposed to the active matrix substrate of the divided mask 16 and in the surrounding region 19, which is a region other than the opening group formation region 18. In the case of the vapor deposition mask 20a, as the protrusions 5 are also provided in the center portion of the divided masks 16 in the vertical direction of the figure, the distance between the divided masks 16 and the active matrix substrate can be maintained at a predetermined distance with a higher accuracy.

In addition with respect to the protrusion 5, also in the case of the vapor deposition mask 20a, before the plurality of divided masks 16 are fixed to the frame 15; that is, after first providing the protrusions 5 to the divided masks 16 alone, a plurality of divided masks 16 may be fixed to the frame 15, and the projections 5 may be provided on the divided masks 16 after the plurality of divided masks 16 are fixed to the frame 15.

In addition, although not depicted in the figures, the protrusions 5 may be provided on both the frame 15 and the divided masks 16.

In this case, considering the thickness of the divided masks 16, it may be desirable to set the height of the protrusions 5 provided on the divided masks 16 to be lower than the height of the protrusions 5 provided on the frame 15 by the thickness of the divided masks 16.

In addition, in the vapor deposition masks 14, 20, and 20a depicted in FIG. 9A, FIG. 9B, and FIG. 9C, an example was described of a case in which the divided masks 16 are fixed to the front side of the frame 15, that is, the surface side of the frame 15 that opposes the active matrix substrate, but the present disclosure is not limited thereto. If the opening group formation region 18 in each of the plurality of divided masks 16 is arranged so as to overlap with the large opening 15a in the center portion of the frame 15 in a plan view, the divided masks 16 may be fixed to the rear surface, that is, the surface of the frame 15 opposite to the surface facing the active matrix substrate.

Note that in the present embodiment, although an example has been described of a case in which the protrusions 5 are formed using a material that does not include beads, the protrusions 5 may be formed of a material including beads as in the third embodiment to be described later.

It should also be noted that in the present embodiment, although an example has been described of a case in which the protrusions 5 are formed in a dot shape, the shape is not particularly limited thereto provided it is one that can be provided outside the opening group formation region 3 on the surface 2a of the metal substrate 2 which opposes the active matrix substrate. For example, the shape may be formed in a linear shape or the like.

Second Embodiment

Next, a second embodiment of the present disclosure will be described to reference to FIGS. 10A to 10F and FIGS. 11A to 11F. The present embodiment differs from the first embodiment in that first resin layers 23, 23a having recesses are formed on the surface 2a of the metal substrate 2 which opposes the active matrix substrate, and the protrusions 5 are formed in the recesses. The other aspects are substantially similar to the description of the first embodiment. For convenience of description, components having the same function as components illustrated in the figures of the first embodiment will be denoted by the same reference numerals, and the description thereof may be omitted.

FIGS. 10A to 10F are diagrams illustrating a method of manufacturing a vapor deposition mask 10b in which a first resin layer 23 having a recess that exposes the surface 2a of the metal substrate 2 opposed to the active matrix substrate (an opening in which the surface 2a of the metal substrate opposed to the active matrix substrate is exposed) is formed on the entire outer surface of the opening group formation region 3 on the surface 2a of the metal substrate 2 opposed to the active matrix substrate, and the protrusions 5 are formed in the recess.

First, as illustrated in FIG. 10A, a photo-curable resin material 21 may be applied using a slit coater (not shown) to the entire surface of the surface 2a of the metal substrate 2 facing the active matrix substrate with the exception of the opening 4 portion.

In the present embodiment, for example, a negative photo-curable resin material formed by dissolving an acrylic resin (acrylic polymer) including polymethyl methacrylate or the like and a photoinitiator in a predetermined solvent and having a photo-cured exposed portion was used as the photo-curable resin material 21, but the present disclosure is not limited herein, and a positive photo-curable resin material may also be used.

Then, after performing exposure using a mask 22 having a light blocking portion 22a and an opening 22c as illustrated in FIG. 10B, it is possible to form the first resin layer 23 having the recess that exposes the surface 2a of the metal substrate 2 opposed to the active matrix substrate by developing, as illustrated in FIG. 10C.

It should be noted that the shape of the recess is not particularly limited, provided that it is formed on the outside of the opening group formation region 3 on the surface 2a of the metal substrate 2 opposed to the active matrix substrate and is surrounded by the first resin layer 23.

Then, as illustrated in FIG. 10D, the photo-curable resin material 6 may be dripped using the ink-jet dripping device 7 into the recess surrounded by the first resin layer 23.

Then, as illustrated in FIG. 10E, as the photo-curable resin material 6 is adjusted to have a viscosity that allows for film thickness adjustment, it can be formed to a constant film thickness in accordance with the drip amount, without widely spreading on the metal substrate 2. Note that, in the present embodiment, after the photo-curable resin material 6 is formed to have a constant film thickness, pre-baking (heat treatment) was performed at a relatively low temperature in order to remove the solvent, and exposure was subsequently performed to photo-cure the photo-curable resin material 6. Then, post-baking was carried out at a relatively high temperature, and a vapor deposition mask 10a provided with protrusions 5 with a height of 4 μm in the recess surrounded by the first resin layer 23 was completed as illustrated in FIG. 10F.

In the manufacturing process of the vapor deposition mask 10a, as the photo-curable resin material 6 is dripped into the recess surrounded by the first resin layer 23, it is no longer necessary to consider spreading of the photo-curable resin material 6 on the metal substrate 2, such that it is possible to widen the viscosity range of the photo-curable resin materials 6 that can be used.

In addition, in the case that the height of the protrusions 5 is 4 μm, the thickness of the first resin layer 23 surrounding the recess is not particularly limited provided that it is less than 4 μm. However, considering that the spreading of the photo-curable resin material 6 can be more effectively suppressed and that the active matrix substrate may have a configuration where it is also supported by the first resin layer 23 when the protrusions 5 are pushed in due to the load of the active matrix substrate or the like, it may be preferable that the thickness of the first resin layer 23 is greater than or equal to 50% and less than 100% of the height of the protrusions 5, and even more preferably greater than or equal to 80% and less than or equal to 100% of the height of the protrusions 5.

Note that in the present embodiment, the thickness of the first resin layer 23 was formed to be 2 μm, which is 50% of the height of the protrusions 5.

FIGS. 11A to 11F are diagrams illustrating a method of manufacturing a vapor deposition mask 10b in which a first resin layer 23a having a recess that does not expose the surface 2a of the metal substrate 2 opposed to the active matrix substrate is formed on the entire outer surface of the opening group formation region 3 on the surface 2a of the metal substrate 2 opposed to the active matrix substrate, and the protrusions 5 are formed in the recess.

Figure 11A:
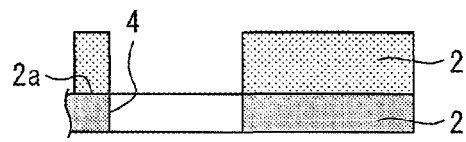
FIGS. 11A to 11F are diagrams illustrating another example of a method of manufacturing a vapor deposition mask in which protrusions are formed within a recess.

First, as illustrated in FIG. 11A, a photo-curable resin material 21 may be applied using a slit coater (not shown)

to the entire surface of the surface 2a of the metal substrate 2 facing the active matrix substrate with the exception of the opening 4 portion.

Figure 11B:
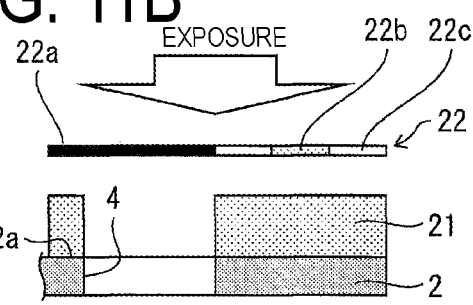
Figure 11C:
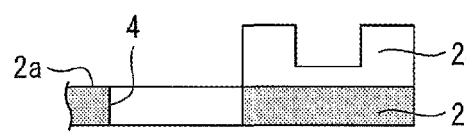

Then, after performing exposure using a mask 22 having a light blocking portion 22a, a slit opening 22b that transmits 30% of the exposure light, and an opening 22c that transmits 100% of the exposure light as illustrated in FIG. 11B, it is possible to form a first resin layer 23a having a recess that does not expose the surface 2a of the metal substrate 2 opposed to the active matrix substrate by developing, as illustrated in FIG. 11C. That is, the first resin layer 23a remains in the recess with a constant film thickness.

As described above, although the manufacturing process of the vapor deposition mask 10b may include a half-exposure step, the present disclosure is not particularly limited thereto, provided that the first resin layer 23a having the recess formed in this half exposure step is a film formed on the entire outer surface of the opening group formation region 3 on the surface 2a opposed to the active matrix substrate of the metal substrate 2, the size and shape of the recess are also formed on the outside of the opening group formation region 3 on the surface 2a opposed to the active matrix substrate of the metal substrate 2 and it is surrounded by the first resin layer 23a.

Figure 11D:
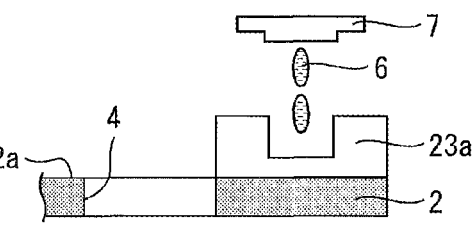

Then, as illustrated in FIG. 11D, the photo-curable resin material 6 may be dripped using the ink-jet dripping device 7 into the recess surrounded by the first resin layer 23a.

Figure 11E:
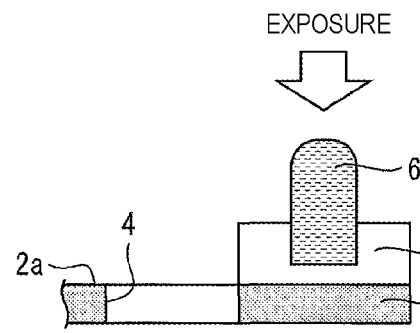
Figure 11F:
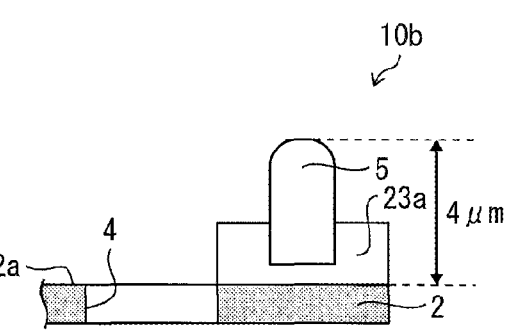

Then, as illustrated in FIG. 11E, as the photo-curable resin material 6 is adjusted to have a viscosity that allows for film thickness adjustment, it can be formed to a constant film thickness in accordance with the drip amount, without widely spreading. Note that, in the present embodiment, after the photo-curable resin material 6 is formed to have a constant film thickness, pre-baking (heat treatment) was performed at a relatively low temperature in order to remove the solvent, and exposure was subsequently performed to photo-cure the photo-curable resin material 6. Then, post-baking was carried out at a relatively high temperature, and a vapor deposition mask 10b provided with protrusions 5 in the recess surrounded by the first resin layer 23a was completed as illustrated in FIG. 11F.

Note that the height of the protrusions 5 was set so that the total film thickness of the first resin layer 23a remaining in the recess together with the height of the protrusion 5 was 4 μm.

In the case of the vapor deposition mask 10b, as the protrusions 5 are formed on the first resin layer 23a remaining in the recess, peeling of the protrusions 5 from the vapor deposition mask 10b can be suppressed.

In addition, in the case that the film thickness of the first resin layer 23a remaining in the recess and the height of the protrusion 5 are 4 μm in total, the thickness of the first resin layer 23a surrounding the recess is not particularly limited provided that it is less than 4 μm. However, considering that the spreading of the photo-curable resin material 6 can be more effectively suppressed and that the active matrix substrate may have a configuration where it is also supported by the first resin layer 23a when the protrusions 5 are pushed in due to the load of the active matrix substrate or the like, it may be preferable that the thickness of the first resin layer 23a is greater than or equal to 50% and less than 100% of the combined value of the film thickness of the first resin layer 23a remaining in the recess and the height of the protrusions 5, and even more preferably greater than or equal to 80% and less than or equal to 100% of the combined value of the film thickness of the first resin layer 23a remaining in the recess and the height of the protrusions 5.

Note that in the present embodiment, the thickness of the first resin layer 23a was formed to be 2 μm, which is 50% of the combined value of the film thickness of the first resin layer 23a remaining in the recess and the height of the protrusions 5.

In addition, in the present embodiment, although an example was described of a case in which a photo-curable resin material 6 was used in FIG. 10D and FIG. 11D, the present disclosure is not limited thereto, and a thermosetting resin material 8 may also be used.

Third Embodiment

Next, a third embodiment of the present disclosure will be described to reference to FIGS. 12A to 12F and FIGS. 13A to 13F. The present embodiment differs from the second embodiment in that first resin layers 23, 23a having recesses are formed on the surface 2a of the metal substrate 2 which opposes the active matrix substrate, and the protrusions 5 are formed in the recesses using a photocurable resin material 25 including beads 24. The other aspects are substantially similar to the description of the second embodiment. For convenience of description, components having the same function as components illustrated in the figures of the second embodiment will be denoted by the same reference numerals, and the description thereof may be omitted.

FIGS. 12A to 12F is a diagram illustrating a method of manufacturing a vapor deposition mask 27 in which a first resin layer 23 having a recess that exposes the surface 2a of the metal substrate 2 opposed to the active matrix substrate (an opening in which the surface 2a of the metal substrate opposed to the active matrix substrate is exposed) is formed on the entire outer surface of the opening group formation region 3 on the surface 2a of the metal substrate 2 opposed to the active matrix substrate, and protrusions 26 including beads 24 are formed in the recess.

Figure 12A:
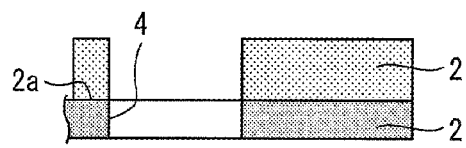
FIGS. 12A to 12F are diagrams illustrating an example of a method of manufacturing a vapor deposition mask in which protrusions made of a material including beads are formed in a recess.

First, as illustrated in FIG. 12A, a photo-curable resin material 21 may be applied using a slit coater (not shown) to the entire surface of the surface 2a of the metal substrate 2 facing the active matrix substrate with the exception of the opening 4 portion.

Figure 12B:
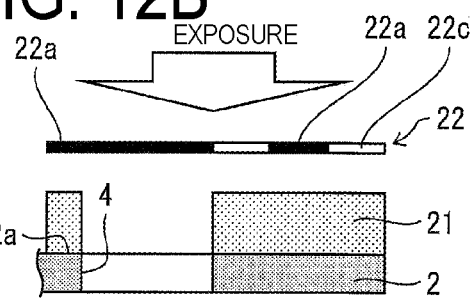
Figure 12C:
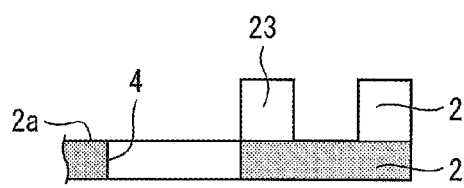

Then, after performing exposure using a mask 22 having a light blocking portion 22a and an opening 22c as illustrated in FIG. 12B, it is possible to form the first resin layer 23 having the recess that exposes the surface 2a of the metal substrate 2 opposed to the active matrix substrate by developing, as illustrated in FIG. 12C.

It should be noted that the shape of the recess is not particularly limited, provided that it is formed on the outside of the opening group formation region 3 on the surface 2a of the metal substrate 2 opposed to the active matrix substrate and is surrounded by the first resin layer 23.

Figure 12D:
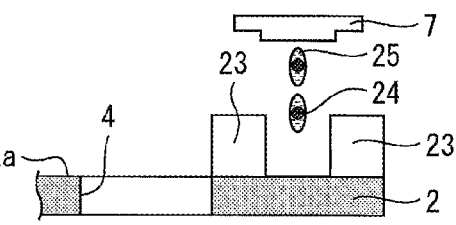

Then, as illustrated in FIG. 12D, a photo-curable resin material 25 including beads 24 may be dripped using the ink-jet dripping device 7 into the recess surrounded by the first resin layer 23.

Note that the average particle size and shape of the beads 24 can be appropriately selected based on consideration of the height of the protrusions 26.

Figure 12E:
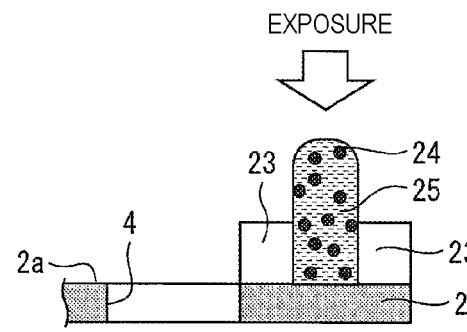
Figure 12F:
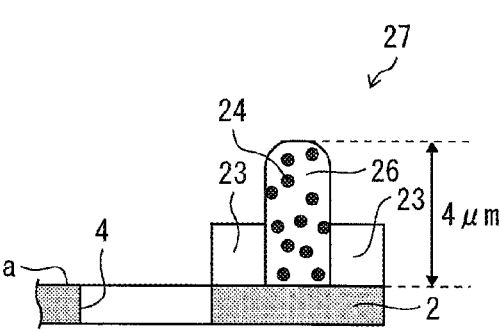

Then, as illustrated in FIG. 12E, as the photo-curable resin material 25 including beads 24 is adjusted to have a viscosity that allows for film thickness adjustment, it can be formed to a constant film thickness in accordance with the drip amount, without widely spreading on the metal substrate 2. Note that, in the present embodiment, after the photo-curable resin material 25 including beads 24 is formed to have a constant film thickness, pre-baking (heat treatment)

was performed at a relatively low temperature in order to remove the solvent, and exposure was subsequently performed to photo-cure the photo-curable resin material 25 including beads 24. Then, post-baking was carried out at a relatively high temperature, and a vapor deposition mask 27 provided with protrusions 26 included the beads 24 and having a height of 4 µm was completed in the recess surrounded by the first resin layer 23 as illustrated in FIG. 12F.

In the manufacturing process of the vapor deposition mask 27, as the photo-curable resin material 25 including beads 24 is dripped into the recess surrounded by the first resin layer 23, it is no longer necessary to consider spreading of the photo-curable resin material 25 including beads 24 on the metal substrate 2, such that it is possible to widen the viscosity range of the photo-curable resin material 25 including beads 24 that can be used.

In addition, in the case that the height of the protrusions 26 is 4 µm, the thickness of the first resin layer 23 surrounding the recess is not particularly limited provided that it is less than 4 µm. However, considering that the spreading of the photo-curable resin material 25 including beads 24 can be more effectively suppressed and that the active matrix substrate may have a configuration where it is also supported by the first resin layer 23 when the protrusions 26 are pushed in due to the load of the active matrix substrate or the like, it may be preferable that the thickness of the first resin layer 23 is greater than or equal to 50% and less than 100% of the height of the protrusions 26, and even more preferably greater than or equal to 80% and less than or equal to 100% of the height of the protrusions 26.

Note that in the present embodiment, the thickness of the first resin layer 23 was formed to be 2 µm, which is 50% of the height of the protrusions 26.

As described above, in the vapor deposition mask 27, as the protrusions 26 include beads 24, it is possible to improve the precision of the height of the protrusions 26 and also improve the strength of the protrusions 26.

FIGS. 13A to 13F are diagrams illustrating a method of manufacturing a vapor deposition mask 27a in which a first resin layer 23a having a recess that does not expose the surface 2a of the metal substrate 2 opposed to the active matrix substrate is formed on the entire outer surface of the opening group formation region 3 on the surface 2a of the metal substrate 2 opposed to the active matrix substrate, and protrusions 26 including beads 24 are formed in the recess.

Figure 13A:
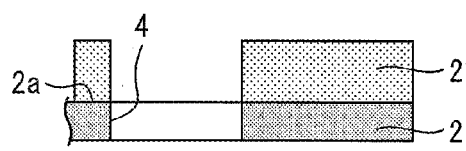
FIGS. 13A to 13F are diagrams illustrating another example of a method of manufacturing a vapor deposition mask in which protrusions made of a material including beads are formed in a recess.

First, as illustrated in FIG. 13A, a photo-curable resin material 21 may be applied using a slit coater (not shown) to the entire surface of the surface 2a of the metal substrate 2 facing the active matrix substrate with the exception of the opening 4 portion.

Figure 13B:
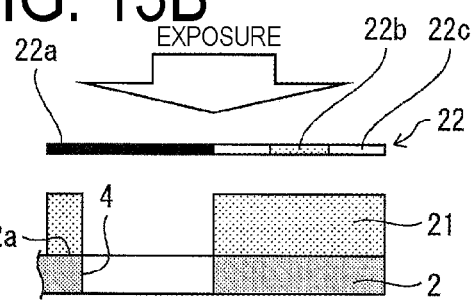
Figure 13C:
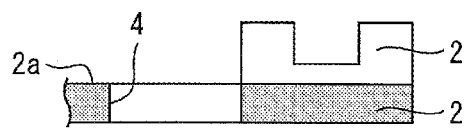

Then, after performing exposure using a mask 22 having a light blocking portion 22a, a slit opening 22b that transmits 30% of the exposure light, and an opening 22c that transmits 100% of the exposure light as illustrated in FIG. 13B, it is possible to form a first resin layer 23a having a recess that does not expose the surface 2a of the metal substrate 2 opposed to the active matrix substrate by developing, as illustrated in FIG. 13C. That is, the first resin layer 23a remains in the recess with a constant film thickness.

Figure 13D:
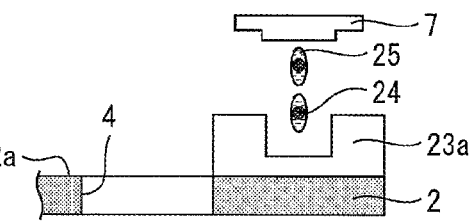

Then, as illustrated in FIG. 13D, a photo-curable resin material 25 including beads 24 may be dripped using the ink-jet dripping device 7 into the recess surrounded by the first resin layer 23a.

Figure 13E:
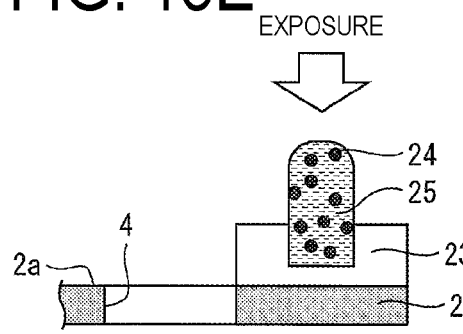
Figure 13F:
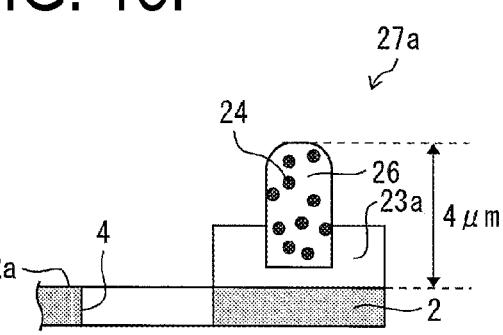

Then, as illustrated in FIG. 13E, as the photo-curable resin material 25 including beads 24 is adjusted to have a viscosity that allows for film thickness adjustment, it can be formed to a constant film thickness in accordance with the drip amount, without widely spreading. Note that, in the present embodiment, after the photo-curable resin material 25 including beads 24 is formed to have a constant film thickness, pre-baking (heat treatment) was performed at a relatively low temperature in order to remove the solvent, and exposure was subsequently performed to photo-cure the photo-curable resin material 25 including beads 24. Then, post-baking was carried out at a relatively high temperature, and a vapor deposition mask 27a provided with protrusions 26 including the beads 24 was completed in the recess surrounded by the first resin layer 23a as illustrated in FIG. 13F.

Note that the height of the protrusions 26 including the beads 24 was set so that the total film thickness of the first resin layer 23a remaining in the recess together with the height of the protrusions 26 including the beads 24 was 4 µm.

In the case of the vapor deposition mask 27a, as the protrusions 26 including the beads 24 are formed on the first resin layer 23a remaining in the recess, peeling of the protrusions 26 including the beads 24 from the vapor deposition mask 27a can be suppressed.

In addition, in the case that the film thickness of the first resin layer 23a remaining in the recess and the height of the protrusions 26 including the beads 24 are 4 µm in total, the thickness of the first resin layer 23a surrounding the recess is not particularly limited provided that it is less than 4 µm. However, considering that the spreading of the photo-curable resin material 25 including the beads 24 can be more effectively suppressed and that the active matrix substrate may have a configuration where it is also supported by the first resin layer 23a when the protrusions 26 including the beads 24 are pushed in due to the load of the active matrix substrate or the like, it may be preferable that the thickness of the first resin layer 23a is greater than or equal to 50% and less than 100% of the combined value of the film thickness of the first resin layer 23a remaining in the recess and the height of the protrusions 26 including the beads 24, and even more preferably greater than or equal to 80% and less than or equal to 100% of the combined value of the film thickness of the first resin layer 23a remaining in the recess and the height of the protrusions 26 including the beads 24.

Note that in the present embodiment, the thickness of the first resin layer 23a was formed to be 2 µm, which is 50% of the combined value of the film thickness of the first resin layer 23a remaining in the recess and the height of the protrusions 26 including the beads 24.

In addition, in the present embodiment, although an example was described of a case in which a photo-curable resin material 25 including the beads 24 was used in FIG. 12D and FIG. 13D, the present disclosure is not limited thereto, and a thermosetting resin material including beads may also be used.

Fourth Embodiment

Next, a fourth embodiment of the present disclosure will be described with reference to FIGS. 14A to 14E and FIG. 15. The present embodiment differs from the third embodiment in that first resin layers 23, 23a having recesses are formed on the surface 2a of the metal substrate 2 which opposes the active matrix substrate, and protrusions 29 are formed in the recess by using the photo-curable resin material 25 including the beads 24 and the thermosetting resin material 28. The other aspects are substantially similar to the description of the second embodiment. For convenience of description, components having the same function as components illustrated in the figures of the third embodiment will be denoted by the same reference numerals, and the description thereof may be omitted.

FIGS. 14A to 14E are diagrams illustrating a method of manufacturing a vapor deposition mask 30 in which a first resin layer 23 having a recess that exposes the surface 2a of the metal substrate 2 opposed to the active matrix substrate (an opening in which the surface 2a of the metal substrate opposed to the active matrix substrate is exposed) is formed on the entire outer surface of the opening group formation region 3 on the surface 2a of the metal substrate 2 opposed to the active matrix substrate, and protrusions 29 are formed in the recess using the photo-curable resin material 25 including the beads 24 and the thermosetting resin material 28.

As illustrated in FIG. 14A, a photo-curable resin material 25 including beads 24 may be dripped using the ink-jet dripping device 7 into the recess surrounded by the first resin layer 23.

Note that, as the process of forming the first resin layer 23 having a recess that exposes the surface 2a of the metal substrate 2 opposed to the active matrix substrate has already been described in the third embodiment, the description thereof will be omitted here.

Then, as illustrated in FIG. 14B, as the photo-curable resin material 25 including the beads 24 is adjusted to have a viscosity that allows for film thickness adjustment, it can be formed to a constant film thickness in accordance with the drip amount, without widely spreading on the metal substrate 2. Note that, in the present embodiment, after the photo-curable resin material 25 including beads 24 is formed to have a constant film thickness, pre-baking (heat treatment) was performed at a relatively low temperature in order to remove the solvent, and exposure was subsequently performed to photo-cure the photo-curable resin material 25 including the beads 24.

Subsequently, as illustrated in FIG. 14C, the thermosetting resin material 28 is dripped using the ink-jet dripping device 7 so as to cover the photo-curable resin material 25 including the cured beads 24. Note that, at this time, the thermosetting resin material 28 is dripped so as to also cover a part of the upper surface of the first resin layer 23.

Then, as illustrated in FIG. 14D, post-baking was carried out at a relatively high temperature, and a vapor deposition mask 30 formed with protrusions 29 with a height of 4 μm in the recess surrounded by the first resin layer 23 was completed using the photo-curable resin material 25 including the beads 24 and the thermosetting resin material 28, as illustrated in FIG. 14E. It should be noted that, due to the thermosetting resin material 28, the protrusions 29 are formed with a wider upper surface, and they are in contact with the upper surface of the first resin layer 23.

Accordingly, in the case that the vapor deposition mask 30 is used, as the active matrix substrate comes into contact with the protrusions 29, scratches are unlikely to occur, and the protrusions 29 are unlikely to be peeled off from the vapor deposition mask 30.

In addition, in the case that the height of the protrusions 29 is 4 μm, the thickness of the first resin layer 23 surrounding the recess is not particularly limited provided that it is less than 4 μm. However, considering that the spreading of the photo-curable resin material 25 including beads 24 can be more effectively suppressed and that the active matrix substrate may have a configuration where it is also supported by the first resin layer 23 when the protrusions 29 are pushed in due to the load of the active matrix substrate or the like, it may be preferable that the thickness of the first resin layer 23 is greater than or equal to 50% and less than 100% of the height of the protrusions 29, and even more preferably greater than or equal to 80% and less than or equal to 100% of the height of the protrusions 29.

Note that in the present embodiment, the thickness of the first resin layer 23 was formed to be 2 μm, which is 50% of the height of the protrusions 29.

Note that in the present embodiment, as illustrated in FIG. 14B, although an example was described of a case in which the formation width of the photo-curable resin material 25 including the beads 24 is formed to be narrower than the width of the recess surrounded by the first resin layer 23, the formation width of the photo-curable resin material 25 including the beads 24 may be the same as the width of the recess surrounded by the first resin layer 23.

In addition, in the present embodiment, although an example was described of a case in which the protrusions 29 are formed using photo-curable resin material 25 including the beads 24 and the thermosetting resin material 28, the present disclosure is not limited thereto, and the protrusions 29 may be formed only using a photo-curable resin material including beads, only a thermosetting resin material including beads, or a thermosetting resin material including beads and a photo-curable resin material.

FIG. 15 is a diagram illustrating a method of manufacturing a vapor deposition mask 30a in which a first resin layer 23a having a recess that does not expose the surface 2a of the metal substrate 2 opposed to the active matrix substrate is formed on the entire outer surface of the opening group formation region 3 on the surface 2a of the metal substrate 2 opposed to the active matrix substrate, and protrusions 29 are formed in the recess using the photo-curable resin material 25 including the beads 24 and the thermosetting resin material 28.

As illustrated in FIG. 15A, a photo-curable resin material 25 including beads 24 may be dripped using the ink-jet dripping device 7 into the recess surrounded by the first resin layer 23a.

Note that, as the process of forming the first resin layer 23a having a recess that does not expose the surface 2a of the metal substrate 2 opposed to the active matrix substrate has already been described in the third embodiment, the description thereof will be omitted here.

Then, as illustrated in FIG. 15B, as the photo-curable resin material 25 including beads 24 is adjusted to have a viscosity that allows for film thickness adjustment, it can be formed to a constant film thickness in accordance with the drip amount, without widely spreading on the metal substrate 2. Note that, in the present embodiment, after the photo-curable resin material 25 including beads 24 is formed to have a constant film thickness, pre-baking (heat treatment) was performed at a relatively low temperature in order to remove the solvent, and exposure was subsequently performed to photo-cure the photo-curable resin material 25 including beads 24.

Subsequently, as illustrated in FIG. 15C, the thermosetting resin material 28 is dripped using the ink-jet dripping device 7 so as to cover the photo-curable resin material 25 including the cured beads 24. Note that, at this time, the thermosetting resin material 28 is dripped so as to also cover a part of the upper surface of the first resin layer 23a.

Then, as illustrated in FIG. 15D, post-baking was carried out at a relatively high temperature, and a vapor deposition mask 30a formed with protrusions 29 with a height of 4 μm in the recess surrounded by the first resin layer 23a was completed using the photo-curable resin material 25 including the beads 24 and the thermosetting resin material 28, as illustrated in FIG. 15E. It should be noted that, due to the thermosetting resin material 28, the protrusions 29 are formed with a wider upper surface, and they are in contact with the upper surface of the first resin layer 23a.

Accordingly, in the case that the vapor deposition mask 30a is used, as the active matrix substrate comes into contact with the protrusions 29, scratches are unlikely to occur, and the protrusions 29 are unlikely to be peeled off from the vapor deposition mask 30a.

In addition, in the case that the film thickness of the first resin layer 23a remaining in the recess and the height of the protrusions 29 including the beads 24 are 4 μm in total, the thickness of the first resin layer 23a surrounding the recess is not particularly limited provided that it is less than 4 μm. However, considering that the spreading of the photo-curable resin material 25 including the beads 24 can be more effectively suppressed and that the active matrix substrate may have a configuration where it is also supported by the first resin layer 23a when the protrusions 29 are pushed in due to the load of the active matrix substrate or the like, it may be preferable that the thickness of the first resin layer 23a is greater than or equal to 50% and less than 100% of the combined height of the film thickness of the first resin layer 23a remaining in the recess and the height of the protrusions 29 including the beads 24, and even more preferably greater than or equal to 80% and less than or equal to 100% of the combined height of the film thickness of the first resin layer 23a remaining in the recess and the height of the protrusions 29 including the beads 24.

Note that in the present embodiment, the thickness of the first resin layer 23a was formed to be 2 μm, which is 50% of the combined height of the film thickness of the first resin layer 23a remaining in the recess and the height of the protrusions 9 including the beads 24.

Note that in the present embodiment, as illustrated in FIG. 15B, although an example was described of a case in which the formation width of the photo-curable resin material 25 including the beads 24 is formed to be narrower than the width of the recess surrounded by the first resin layer 23a, the formation width of the photo-curable resin material 25 including the beads 24 may be the same as the width of the recess surrounded by the first resin layer 23a.

In addition, in the present embodiment, although an example was described of a case in which the protrusions 29 are formed using photo-curable resin material 25 including the beads 24 and the thermosetting resin material 28, the present disclosure is not limited thereto, and the protrusions 29 may be formed only using a photo-curable resin material including beads, only a thermosetting resin material including beads, or a thermosetting resin material including beads and a photo-curable resin material.

In the case of the vapor deposition mask 30a, as the protrusions 29 including the beads 24 are formed on the first resin layer 23a remaining in the recess, peeling of the protrusions 29 including the beads 24 from the vapor deposition mask 30a can be suppressed.

Fifth Embodiment

Next, a fifth embodiment of the present disclosure will be described with reference to FIG. 16 and FIG. 17. In the present embodiment, a method of manufacturing an organic EL display device using the vapor deposition mask 1 will be described. For convenience of description, components having the same function as components illustrated in the figures of the first through fourth embodiments will be denoted by the same reference numerals, and the description thereof may be omitted.

Figure 16:
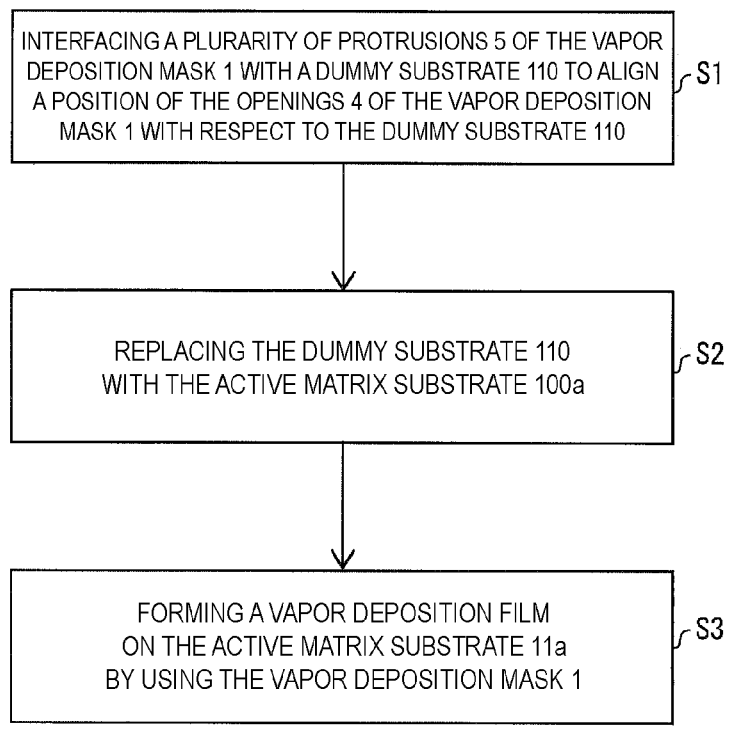
FIG. 16 is a diagram for describing each step of a method of manufacturing an organic EL display device using a vapor deposition mask.
Figure 17A:
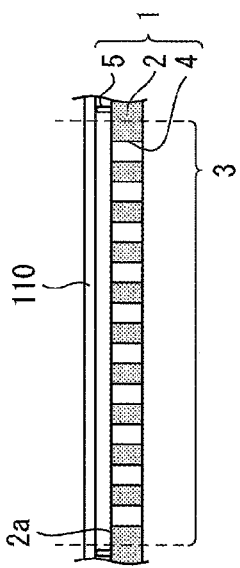
FIGS. 17A to 17C are diagrams corresponding to each step of a method of manufacturing an organic EL display device using the vapor deposition mask depicted in FIG. 16.
Figure 17B:
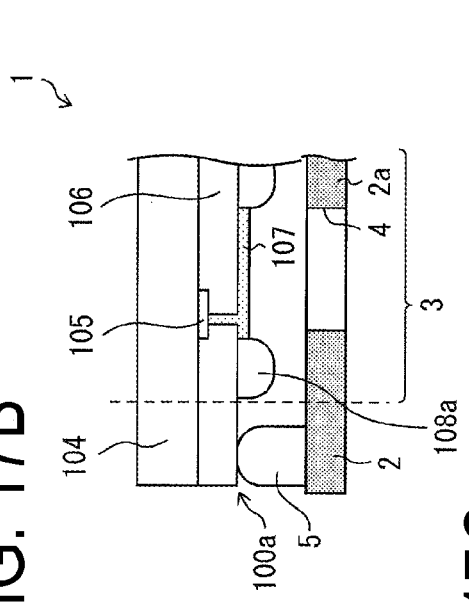
Figure 17C:
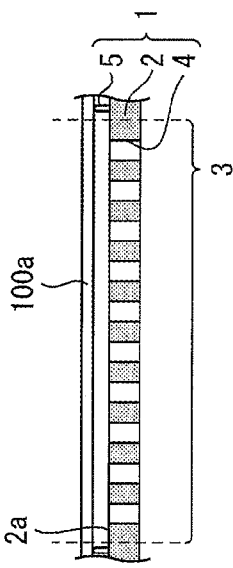
Figure 18A:
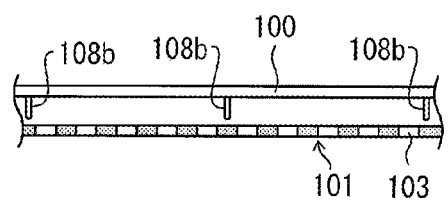
FIGS. 18A and 18B are diagrams for describing a case where an existing active matrix substrate provided with edge covers having different heights and an existing separately patterning vapor deposition mask do not completely adhere.
Figure 18B:
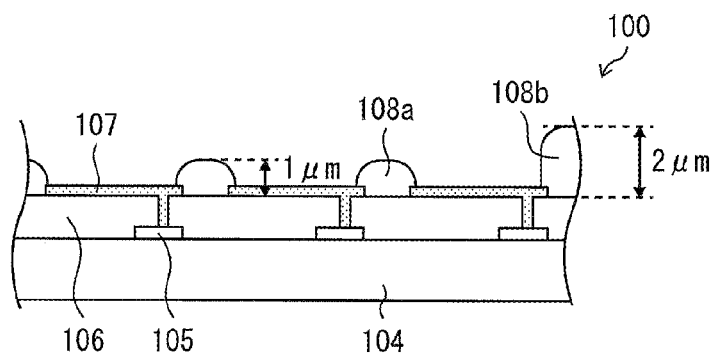
Figure 19:
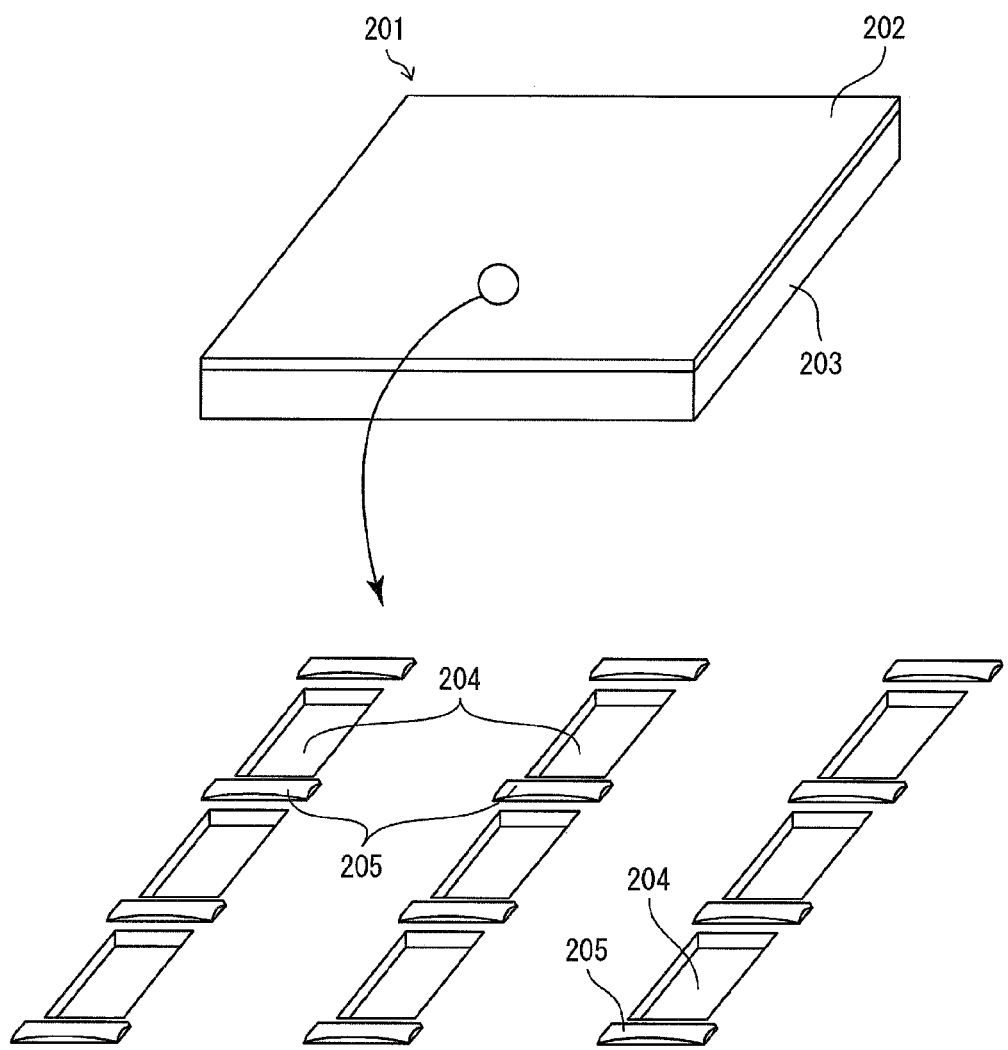
FIG. 19 is a diagram illustrating a schematic configuration of a separately patterning vapor deposition mask disclosed in PTL1.

FIG. 16 is a diagram for describing each step of a method of manufacturing an organic EL display device using the vapor deposition mask 1, and FIGS. 17A to 17C are diagram corresponding to each step of the method of manufacturing the organic EL display device using the vapor deposition mask depicted in FIG. 16.

In the method of manufacturing the organic EL display device using the vapor deposition mask 1, as illustrated in FIG. 17A, a step (S1) is first performed in which the protrusions 5 of the vapor deposition mask 1 and a dummy substrate (planar substrate) 110 are interfaced with each other, and the position of the openings 4 of the vapor deposition mask 1 are aligned with respect to the dummy substrate 110. Note that the dummy substrate 110 is a substrate on which a vapor deposition film used for manufacturing the active matrix substrate 100a is not formed.

In the above step (S1), as the dummy substrate 110 is used, the protrusions 5 of the vapor deposition mask 1 and the dummy substrate 110 can be interfaced with each other so that the position of the openings 4 of the vapor deposition mask 1 can be aligned with respect to the dummy substrate 110. That is, in a state where the protrusion 5 of the vapor deposition mask 1 and the dummy substrate 110 are interfaced with each other, it is possible to perform position alignment while moving the vapor deposition mask 1 with respect to the dummy substrate 110. As there is no projection such as the edge cover 108a on the dummy substrate 110, it is not necessary to take into account contact between the vapor deposition mask 1 and the protrusions 5 during movement of the vapor deposition mask 1.

It should be noted that, although not depicted in FIG. 17A, the vapor deposition mask 1 may be supported by a movable mask holder, and the dummy substrate 110 may be supported by a fixed substrate holder.

As described above, as the openings 4 of the vapor deposition mask 1 are aligned in advance in a state where the protrusions 5 of the vapor deposition mask 1 and the dummy substrate 110 are interfaced with each other, in a state described later where the active matrix substrate 100a and the vapor deposition mask 1 are interfaced with each other, it is possible to suppress deviation in the position of the openings 4 of the vapor deposition mask 1 in a step (S3) of forming a vapor deposition film on the active matrix substrate 100a by using the vapor deposition mask 1.

Next, as illustrated in FIG. 17B, in a state where the vapor deposition mask 1 is fixed, a step (S2) is performed of replacing the dummy substrate 110 supported by the fixed substrate holder with the active matrix substrate 100a.

Next, as illustrated in FIG. 17C, a step (S3) of forming a vapor deposition film on the active matrix substrate 100a is performed using the vapor deposition mask 1.

In the above step (S3), in a state where the active matrix substrate 100a and the vapor deposition mask 1 are interfaced with each other, the vapor deposition particles emitted from the vapor deposition source (not shown) are formed in a predetermined shape on the active matrix substrate 100a via the vapor deposition mask 1.

It should be noted that, in the present embodiment, although an example was described of a case in which the openings 4 of the vapor deposition mask 1 are aligned in advance by using the dummy substrate 110, the present disclosure is not limited thereto. For example, as illustrated in FIG. 17B, in a state where the protrusions 5 of the vapor deposition mask 1 and the interlayer insulating film 106, which is a flattening film, of the active matrix substrate 100a are interfaced with each other, position alignment may be performed while moving one of the active matrix substrate 100a or the vapor deposition mask 1 with respect to the other. In this case, it is necessary to take into account the contact between the edge cover 108a of the active matrix substrate 100a and the protrusions 5 of the vapor deposition mask 1 during movement.

Supplement

A vapor deposition mask according to a first aspect of the present disclosure includes a vapor deposition mask including a substrate provided with a plurality of openings to pass vapor deposition particles, wherein at least a portion of the plurality of openings are structured by one or more opening groups, the plurality of openings being repeatedly arranged in accordance with a constant rule, an opening group formation region is a region in the substrate including at least a plurality of openings belonging to each of the opening groups and a region between adjacent openings of the plurality of openings belonging to each of the opening groups, and a plurality of protrusions of identical height are arranged to support the entire substrate from one side, and are provided only outside the opening group formation region.

According to the above configuration, as the plurality of protrusions of identical height are arranged to support the entire substrate from one side and are provided only outside the opening group formation region, it is possible to realize a vapor deposition mask capable of forming a uniform vapor deposition film on an active matrix substrate.

In the vapor deposition mask according to a second aspect of the present disclosure, in the first aspect, the plurality of protrusions may be formed of a resin containing a photo-curable resin material.

According to the above configuration, the protrusions can be formed using photo-curing.

In the vapor deposition mask according to a third aspect of the present disclosure, in the first aspect, the plurality of protrusions may be formed of a resin containing a thermo-setting resin material.

According to the above configuration, the protrusions can be formed using thermal-curing.

In the vapor deposition mask according to a fourth aspect of the present disclosure, in the second or third aspects, the plurality of protrusions may be formed of a resin including beads.

According to the above configuration, it is possible to improve the height accuracy of the protrusions and the strength of the protrusions.

The vapor deposition mask according to a fifth aspect of the present disclosure, in any one of the first through fourth aspects, may include a plurality of divided substrates which are substrates provided with a plurality of openings to pass vapor deposition particles and a border-shaped frame, wherein each of the plurality of divided substrates may be fixed on the frame such that the plurality of openings to pass the vapor deposition particles in each of the plurality of divided substrates and an opening of the frame overlap in a plan view.

According to the above configuration, it is possible to realize a vapor deposition mask in which each of the plurality of divided substrates is fixed to the frame.

In the vapor deposition mask according to a sixth aspect of the present disclosure, in any one of the first through fifth aspects, a first resin layer provided with a recess that exposes the substrate may be formed outside the opening group formation region of the substrate, and the plurality of protrusions may be provided in the recess with a height such that the protrusions project from the recess.

According to the above configuration, as the protrusions are provided in the recess, it is easy to control the width of the protrusions.

In the vapor deposition mask according to a seventh aspect of the present disclosure, in any one of the first through fifth aspects, a first resin layer having a recess of identical depth may be formed outside the opening group formation region of the substrate, and the plurality of protrusions may be provided in the recess of the first resin layer with a height such that the protrusions project from the recess.

According to the above configuration, as the protrusions are provided in the recess, the width of the protrusions can be easily controlled and the protrusions are formed on the first resin layer, such that the protrusions are less likely to peel off from the vapor deposition mask.

In the vapor deposition mask according to an eighth aspect of the present disclosure, in the sixth aspect, a height of the first resin layer surrounding the recess may be greater than or equal to 50% and less than 100% of the height of the plurality of protrusions.

According to the above configuration, in the case that the protrusions are pushed in due to the load of the active matrix substrate or the like, the active matrix substrate may also be supported by the first resin layer.

In the vapor deposition mask according to a ninth aspect of the present disclosure, in the seventh aspect, a height of the first resin layer surrounding the recess may be greater than or equal to 50% and less than 100% of a value obtained by combining a thickness of the first resin layer and the height of the plurality of protrusions in the recess.

According to the above configuration, in the case that the protrusions are pushed in due to the load of the active matrix substrate or the like, the active matrix substrate may also be supported by the first resin layer.

In the vapor deposition mask according to a tenth aspect of the present disclosure, in any of the sixth through ninth aspects, the plurality of protrusions may be formed in the recess and a part of an upper surface of the first resin layer surrounding the recess.

According to the above configuration, scratches are unlikely to occur on the active matrix substrate contacting the protrusions, and the protrusions are unlikely to be peeled off from the vapor deposition mask.

In the vapor deposition mask according to an eleventh aspect of the present disclosure, in any of the first through tenth aspects, the plurality of protrusions may be formed in a dot-shape.

According to the above configuration, as the protrusions are formed in a dot-shape, contact with the edge cover of the active matrix substrate can be suppressed in comparison with the case where the protrusions are formed in a linear shape, or the like.

A method for manufacturing a vapor deposition mask according to a twelfth aspect of the present disclosure includes a method for manufacturing a vapor deposition mask provided with a plurality of openings to pass vapor deposition particles, wherein at least a portion of the plurality of openings are structured by one or more opening groups, the plurality of openings being repeatedly arranged in accordance with a constant rule, and an opening group formation region is a region in the substrate including at least a plurality of openings belonging to each of the opening groups and a region between adjacent openings of the plurality of openings belonging to each of the opening groups, the method including forming, only outside the opening group formation region, a plurality of protrusions of identical height with an arrangement to support the entire substrate from one side.

According to the above method, as a protrusion forming step is included for forming a plurality of protrusions of identical height only outside the opening group formation region of the substrate with an arrangement capable of supporting the entire substrate from one side, it is possible to realize a manufacturing method of a vapor deposition mask capable of forming a uniform vapor deposition film on an active matrix substrate.

In the method for manufacturing the vapor deposition mask according to a thirteenth aspect of the present disclosure, in the twelfth aspect, in the forming of the plurality of protrusions, the plurality of protrusions may be formed by dripping a liquid resin material including a photo-curable resin material on a predetermined location and photo-curing the liquid resin material.

According to the above method, the protrusions can be formed using a liquid resin material dripping method and light curing.

In the method for manufacturing the vapor deposition mask according to a fourteenth aspect of the present disclosure, in the twelfth aspect, in the forming of the plurality of protrusions, the plurality of protrusions may be formed by dripping a liquid resin material including a thermo-setting resin material on a predetermined location, and thermo-setting the liquid resin material.

According to the above method, the protrusions can be formed using a liquid resin material dripping method and thermal curing.

In the method for manufacturing the vapor deposition mask according to a fifteenth aspect of the present disclosure, in the thirteenth or fourteenth aspects, a liquid resin material including beads may be used in the forming of the plurality of protrusions.

According to the above method, it is possible to improve the height accuracy of the protrusions and the strength of the protrusions.

In the method for manufacturing the vapor deposition mask according to a sixteenth aspect of the present disclosure, in any of the twelfth through the fifteenth aspects, the vapor deposition mask sheet may further include a plurality of divided substrates which are substrates provided with a plurality of openings to pass vapor deposition particles, and a border-shaped frame, and the method may further include fixing, before forming of the plurality of protrusions, each of the plurality of divided substrates on the frame such that the plurality of openings to pass the vapor deposition particles in each of the plurality of divided substrates and an opening of the frame overlap in a plan view.

According to the above method, it is possible to realize a vapor deposition mask provided with the protrusions where each of the plurality of divided substrates are fixed to the frame.

In the method for manufacturing the vapor deposition mask according to a seventeenth aspect of the present disclosure, in any of the twelfth through the fifteenth aspects, the vapor deposition mask sheet may further include a plurality of divided substrates which are substrates provided with a plurality of openings to pass vapor deposition particles, and a border-shaped frame, and the method may further include fixing, after forming of the plurality of protrusions, each of the plurality of divided substrates on the frame such that the plurality of openings to pass the vapor deposition particles in each of the plurality of divided substrates and an opening of the frame overlap in a plan view.

According to the above method, it is possible to realize a vapor deposition mask provided with the protrusions where each of the plurality of divided substrates are fixed to the frame.

The method for manufacturing the vapor deposition mask according to an eighteenth aspect of the present disclosure, in any of the twelfth through the seventeenth aspects, may include forming, outside the opening group formation region of the substrate, a first resin layer provided with a recess that exposes the substrate, and forming, in the recess, the plurality of protrusions with a height so as to project from the recess, wherein, in the forming of the plurality of protrusions in the recess with a height so as to project from the recess, the plurality of protrusions are formed by dripping a liquid resin material on a predetermined portion of the recess, and curing the liquid resin material.

According to the above method, as the protrusions are formed by dripping a liquid resin material onto a predetermined location of the recess and curing it, it is easy to control the width of the protrusions.

The method for manufacturing the vapor deposition mask according to a nineteenth aspect of the present disclosure, in any of the twelfth through the seventeenth aspects, may include forming, outside the opening group formation region of the substrate, a first resin layer provided with a recess of identical depth, and forming, in the recess on the first resin layer, the plurality of protrusions with a height such that the protrusions project from the recess, wherein, in the forming of the plurality of protrusions in the recess on the first resin layer with a height such that the protrusions project from the recess, the plurality of protrusions are formed by dripping a liquid resin material on a predetermined portion of the recess, and curing the liquid resin material.

According to the above method, as the protrusions are formed by dripping a liquid resin material onto a predetermined location of the recess on the first resin layer and curing it, it is easy to control the width of the protrusions, and the protrusions are unlikely to peel off from the vapor deposition mask.

In the method for manufacturing the vapor deposition mask according to a twentieth aspect of the present disclosure, in the eighteenth aspect, in the forming of the first resin layer, a height of the first resin layer surrounding the recess may be greater than or equal to 50% and less than 100% of the height of the plurality of protrusions.

According to the above configuration, it is possible to realize a vapor deposition mask in which the active matrix substrate is also supported by the first resin layer in the case that the protrusions are pushed in due to the load of the active matrix substrate.

In the method for manufacturing the vapor deposition mask according to a twenty-first aspect of the present disclosure, in the nineteenth aspect, in the forming of the first resin layer, a height of the first resin layer surrounding the recess may be greater than or equal to 50% and less than 100% of a value obtained by combining a thickness of the first resin layer and the height of the plurality of protrusions in the recess.

According to the above configuration, it is possible to realize a vapor deposition mask in which the active matrix substrate is also supported by the first resin layer in the case that the protrusions are pushed in due to the load of the active matrix substrate.

In the method for manufacturing the vapor deposition mask according to a twenty-second aspect of the present disclosure, in any one of the eighteenth aspect through the twenty-first aspect, the plurality of protrusions may be formed in the recess and on a part of an upper surface of the first resin layer surrounding the recess.

According to the above method, it is possible to realize a vapor deposition mask in which scratches are unlikely to occur on the active matrix substrate contacting the protrusions, and the protrusions are unlikely to be peeled off from the vapor deposition mask.

In the method for manufacturing the vapor deposition mask according to a twenty-third aspect of the present disclosure, in any of the twelfth aspect through the twenty-second aspect, in the forming of the plurality of protrusions, the plurality of protrusions may be formed in a dot-shape.

According to the above configuration, it is possible to realize a vapor deposition mask in which contact with the edge cover of the active matrix substrate can be suppressed in comparison with the case where the protrusions are formed in a linear shape, or the like.

A method for manufacturing an organic EL display device according to a twenty-fourth aspect of the present disclosure, in any one of the first aspect through the eleventh aspect, includes interfacing a plurality of protrusions of the vapor deposition mask according to any one of embodiments 1 to 11 with a planar substrate to align a position of openings of the vapor deposition mask with respect to the planar substrate.

According to the above method, as the protrusions of the vapor deposition mask and the planar substrate are interfaced with each other and position alignment of the openings of the vapor deposition mask is performed with respect to the planar substrate, it is possible to suppress the occurrence of misalignment of the openings of the vapor deposition mask in the vapor deposition step, which is a subsequent step.

In the method for manufacturing the organic EL display device according to a twenty-fifth aspect of the present disclosure, in the twenty-fourth aspect, may include replacing the planar substrate with an active matrix substrate, and forming, in a state where the plurality of protrusions of the vapor deposition mask and the active matrix substrate are interfaced with each other, a vapor deposition film on the active matrix substrate using the vapor deposition mask.

According to the above method, in a state where the protrusions of the vapor deposition mask and the active matrix substrate are interfaced with each other, in the step of forming the vapor deposition film on the active matrix substrate using the vapor deposition mask, it is possible to suppress the occurrence of misalignment of the openings of the vapor deposition mask.

A method for manufacturing an organic EL display device according to a twenty-sixth aspect of the present disclosure includes interfacing a plurality of protrusions of the vapor deposition mask according to any one of embodiments 1 to 11 with an active matrix substrate.

According to the above method, it is possible to realize a manufacturing method of an organic EL display device capable of forming a uniform vapor deposition film on an active matrix substrate.

The method for manufacturing the organic EL display device according to a twenty-seventh aspect of the present disclosure, in the twenty-sixth aspect, may include interfacing, in interfacing of the plurality of protrusions of a vapor deposition mask with an active matrix substrate, the plurality of protrusions of the vapor deposition mask with a lower insulating film than an interlayer insulating film included in a formation layer of an active element provided on the active matrix substrate.

According to the above method, the gap between the vapor deposition mask and the active matrix substrate can be further reduced.

A method for manufacturing an organic EL display device according to a twenty-eighth aspect of the present disclosure, in the twenty-sixth aspect, includes interfacing, in interfacing of the plurality of protrusions of a vapor deposition mask with an active matrix substrate, the plurality of protrusions of the vapor deposition mask with an interlayer insulating film formed near a display region of the active matrix substrate and included in a formation layer of an active element provided on the active matrix substrate.

According to the above method, the gap between the vapor deposition mask and the active matrix substrate can be reliably secured.

Additional Notes

The present disclosure is not limited to each of the embodiments stated above, and various modifications may be implemented within a range not departing from the scope of the claims. Embodiments obtained by appropriately combining technical approaches stated in each of the different embodiments also fall within the scope of the technology of the present disclosure. Moreover, novel technical features may be formed by combining the technical approaches stated in each of the embodiments.

INDUSTRIAL APPLICABILITY

The present disclosure can be applied to vapor deposition masks, methods for manufacturing vapor deposition masks, and methods of manufacturing organic EL display devices.

REFERENCE SIGNS LIST

1 Vapor deposition mask
1a Vapor deposition mask
1b Vapor deposition mask
2 Metallic substrate (substrate)
2a Surface opposing the active matrix substrate (surface on one side of the substrate)
3 Opening group formation region
4 Opening (through-hole)
4' Opening (through-hole)
4" Opening (through-hole)
5 Protrusion
6 Photo-curable resin material
7 Ink-jet dripping device
8 Thermo-setting resin material
9 Protrusion
10 Vapor deposition mask
10a Vapor deposition mask
10b Vapor deposition mask
11 Photo-curable resin material
12 Protrusion
13 Vapor deposition mask
14 Vapor deposition mask
15 Frame
15a Opening
16 Divided mask (divided substrate)
17 Metal plate
18 Opening group formation region
19 Surrounding region
20 Vapor deposition mask
20a Vapor deposition mask 21 Photo-curable resin material
23 First resin layer
23a First resin layer
24 Beads
25 Photo-curable resin material
26 Protrusion
27 Vapor deposition mask
27a Vapor deposition mask
28 Thermo-setting resin material
29 Protrusion
30 Vapor deposition mask
30a Vapor deposition mask
100a Active matrix substrate
100b Active matrix substrate
106 Interlayer insulating film
109 Inorganic film (insulating film)
110 Dummy substrate (planar substrate)

The invention claimed is:

1. A vapor deposition mask comprising,
a substrate provided with a plurality of openings to pass vapor deposition particles;
wherein at least a portion of the plurality of openings are structured by one or more opening groups, the plurality of openings being repeatedly arranged in accordance with a constant rule,
an opening group formation region is a region in the substrate including at least a plurality of openings belonging to each of the opening groups and a region between adjacent openings of the plurality of openings belonging to each of the opening groups,
a plurality of protrusions of identical height are arranged to support the entire substrate from one side, and are provided only outside the opening group formation region,
a first resin layer provided with a recess that exposes the substrate is formed outside the opening group formation region of the substrate, and
the plurality of protrusions are provided in the recess with a height such that the protrusions project from the recess.

2. The vapor deposition mask according to claim 1, wherein a height of the first resin layer surrounding the recess is greater than or equal to 50% and less than 100% of the height of the plurality of protrusions.

3. The vapor deposition mask according to claim 1, wherein the plurality of protrusions are formed in the recess and on a part of an upper surface of the first resin layer surrounding the recess.

4. The vapor deposition mask according to claims 1, wherein the plurality of protrusions are formed in a dot-shape.

5. The vapor deposition mask according to claim 1, wherein the plurality of protrusions are formed of a resin containing a photo-curable resin material.

6. The vapor deposition mask according to claim 1, wherein the plurality of protrusions are formed of a resin containing a thermosetting resin material.

7. The vapor deposition mask according to claim 5, wherein the plurality of protrusions are formed of a resin including beads.

8. The vapor deposition mask according to claim 1, further comprising:
a plurality of divided substrates which are substrates provided with a plurality of openings to pass vapor deposition particles; and
a border-shaped frame,
wherein each of the plurality of divided substrates is fixed on the frame such that the plurality of openings to pass the vapor deposition particles in each of the plurality of divided substrates and an opening of the frame overlap in a plan view.

9. A method for manufacturing an organic EL display device using a vapor deposition mask,
the vapor deposition mask including:
a substrate provided with a plurality of openings for passing vapor deposition particles;
wherein at least a portion of the plurality of openings are structured by one or more opening groups, the plurality of openings being repeatedly arranged in accordance with a constant rule,
an opening group formation region is a region in the substrate including at least a plurality of openings belonging to each of the opening groups and a region between adjacent openings of the plurality of openings belonging to each of the opening groups, and
a plurality of protrusions of identical height are arranged to support the entire substrate from one side, and are provided only outside the opening group formation region,
the method comprising:
interfacing of the plurality of protrusions of the vapor deposition mask with an active matrix substrate, and
wherein, in interfacing the plurality of protrusions of the vapor deposition mask with the active matrix substrate, the plurality of protrusions of the vapor deposition mask are interfaced with a lower insulating film than an interlayer insulating film included in a formation layer of an active element provided on the active matrix substrate.

10. The vapor deposition mask according to claim 9, wherein a first resin layer provided with a recess that exposes the substrate is formed outside the opening group formation region of the substrate; and
the plurality of protrusions are provided in the recess with a height such that the protrusions project from the recess.

11. The vapor deposition mask according to claim 9, wherein a first resin layer having a recess of identical depth is formed outside the opening group formation region of the substrate; and
the plurality of protrusions are provided in the recess of the first resin layer with a height such that the protrusions project from the recess.

12. The vapor deposition mask according to claim 10, wherein a height of the first resin layer surrounding the recess is greater than or equal to 50% and less than 100% of the height of the plurality of protrusions.

13. The vapor deposition mask according to claim 11, wherein a height of the first resin layer surrounding the recess is greater than or equal to 50% and less than 100% of a value obtained by combining a thickness of the first resin layer in the recess and the height of the plurality of protrusions.

14. The vapor deposition mask according to claim 10, wherein the plurality of protrusions are formed in the recess and on a part of an upper surface of the first resin layer surrounding the recess.

15. A method for manufacturing an organic EL display device, using a vapor deposition mask,
the vapor deposition mask including:
a substrate provided with a plurality of openings to pass vapor deposition particles;

wherein at least a portion of the plurality of openings are structured by one or more opening groups, the plurality of openings being repeatedly arranged in accordance with a constant rule, an opening group formation region is a region in the substrate including at least a plurality of openings belonging to each of the opening groups and a region between adjacent openings of the plurality of openings belonging to each of the opening groups, and a plurality of protrusions of identical height are arranged to support the entire substrate from one side, and are provided only outside the opening group formation region, the method comprising:

interfacing the plurality of protrusions of the vapor deposition mask with an active matrix substrate, and wherein, in interfacing of the plurality of protrusions of a vapor deposition mask with an active matrix substrate, the plurality of protrusions of the vapor deposition mask are interfaced with an interlayer insulating film formed near a display region of the active matrix substrate and included in a formation layer of an active element provided on the active matrix substrate.

16. The vapor deposition mask according to claim 15, wherein a first resin layer provided with a recess that exposes the substrate is formed outside the opening group formation region of the substrate; and the plurality of protrusions are provided in the recess with a height such that the protrusions project from the recess.

17. The vapor deposition mask according to claim 15, wherein a first resin layer having a recess of identical depth is formed outside the opening group formation region of the substrate; and the plurality of protrusions are provided in the recess of the first resin layer with a height such that the protrusions project from the recess.

18. The vapor deposition mask according to claim 16, wherein a height of the first resin layer surrounding the recess is greater than or equal to 50% and less than 100% of the height of the plurality of protrusions.

19. The vapor deposition mask according to claim 17, wherein a height of the first resin layer surrounding the recess is greater than or equal to 50% and less than 100% of a value obtained by combining a thickness of the first resin layer in the recess and the height of the plurality of protrusions.

20. The vapor deposition mask according to claim 16, wherein the plurality of protrusions are formed in the recess and a part of an upper surface of the first resin layer surrounding the recess.

* * * * *